US012572021B1

(12) United States Patent
Young et al.

(10) Patent No.: US 12,572,021 B1
(45) Date of Patent: Mar. 10, 2026

(54) FRAME ASSEMBLY FOR ELECTRONIC DEVICE

(71) Applicants: Austin S. Young, San Jose, CA (US); Christopher Patton, San Jose, CA (US); Alison Shutzberg, Sunnyvale, CA (US)

(72) Inventors: Austin S. Young, San Jose, CA (US); Christopher Patton, San Jose, CA (US); Alison Shutzberg, Sunnyvale, CA (US)

(73) Assignee: APPLE INC., Cupertino, CA (US)

( * ) Notice: Subject to any disclaimer, the term of this patent is extended or adjusted under 35 U.S.C. 154(b) by 419 days.

(21) Appl. No.: 17/207,050

(22) Filed: Mar. 19, 2021

Related U.S. Application Data

(60) Provisional application No. 63/022,004, filed on May 8, 2020.

(51) Int. Cl.
G02B 27/01 (2006.01)
G02C 5/14 (2006.01)
(Continued)

(52) U.S. Cl.
CPC ......... G02B 27/0176 (2013.01); G02C 5/146 (2013.01); G02C 5/22 (2013.01);
(Continued)

(58) Field of Classification Search
CPC ........ G02B 27/0176; G02B 2027/0178; G02C 5/146; G02C 5/22; G02C 9/00;
(Continued)

(56) References Cited

U.S. PATENT DOCUMENTS 3,874,775 A * 4/1975 Lazarus ................... G02C 5/20
351/158
4,274,128 A * 6/1981 Malis ....................... G02C 7/08
16/337
(Continued)

FOREIGN PATENT DOCUMENTS

CA 3024952 A1 * 5/2019 ............. G02C 5/006
FR 2997769 A1 * 5/2014 ............. G02C 5/146
(Continued)

OTHER PUBLICATIONS

Ozan Cakmakci et al., Head-Worn Displays: A Review, 2 Journal of Display Technology 199-216 (2006). (Year: 2006).*
(Continued)

*Primary Examiner* — Stephone B Allen
(74) *Attorney, Agent, or Firm* — Young Basile Hanlon & MacFarlane, P.C.

(57) ABSTRACT

An electronic device includes a light-emitting display system, a frame portion, an arm portion, a lateral joint that is connected between the frame portion and the arm portion, and an elevational joint that is connected between the frame portion and the arm portion. The lateral joint is biased toward a neutral position and is movable away from the neutral position to define a lateral position of the arm portion with respect to the frame portion. The elevational joint is adjustable to define an elevational position of the arm portion with respect to the frame portion.

19 Claims, 28 Drawing Sheets

(51) Int. Cl.

| | | |
|---|---|---|
| *G02C 5/22* | (2006.01) | |
| *G09G 3/00* | (2006.01) | |
| *H05K 5/00* | (2006.01) | |
| *H05K 5/02* | (2006.01) | |
| *G02C 9/00* | (2006.01) | |

(52) U.S. Cl.
CPC ........... *G09G 3/001* (2013.01); *H05K 5/0018* (2022.08); *H05K 5/0217* (2013.01); *G02B 2027/0178* (2013.01); *G02C 9/00* (2013.01); *G02C 2200/02* (2013.01); *G02C 2200/06* (2013.01); *G09G 2330/02* (2013.01)

(58) Field of Classification Search
CPC ........... G02C 2200/02; G02C 2200/06; G09G 3/001; G09G 2330/02; H05K 5/0017; H05K 5/0217

See application file for complete search history.

(56) References Cited

U.S. PATENT DOCUMENTS

| | | | | |
|---|---|---|---|---|
| 5,009,495 | A * | 4/1991 | Williams | G02C 5/008 351/153 |
| 5,009,496 | A | 4/1991 | Holtan, Jr. et al. | |
| 5,162,828 | A * | 11/1992 | Furness | G01S 13/60 351/158 |
| 5,638,146 | A * | 6/1997 | Nannini | G02C 5/006 2/454 |
| 5,638,147 | A * | 6/1997 | Wang-Lee | G02C 5/10 351/120 |
| 5,724,119 | A * | 3/1998 | Leight | A61F 9/029 351/158 |
| 5,959,715 | A * | 9/1999 | Jaffelin | G02C 5/2254 351/114 |
| 5,980,038 | A * | 11/1999 | Chen | G02C 5/2263 351/120 |
| 6,364,479 | B1 | 4/2002 | Wu | |
| 6,574,836 | B1 * | 6/2003 | Steeber | E05D 11/082 16/337 |
| 6,755,523 | B1 * | 6/2004 | Wiedner | G02C 5/2263 351/63 |
| 6,786,594 | B1 * | 9/2004 | Lucas | G02C 1/02 351/110 |
| 7,380,935 | B2 * | 6/2008 | Ifergan | G02C 5/2263 351/153 |
| 7,543,932 | B1 | 6/2009 | Isabelle et al. | |
| 7,621,633 | B1 * | 11/2009 | Foster | G02C 5/001 351/52 |
| 8,517,532 | B1 * | 8/2013 | Hicks | G02C 5/229 351/63 |
| 9,778,483 | B2 | 10/2017 | Chen | |
| 9,875,406 | B2 * | 1/2018 | Haddick | G06F 3/012 |
| 9,968,297 | B2 | 5/2018 | Connor | |
| 10,353,206 | B2 * | 7/2019 | Guo | H04R 1/1008 |
| 10,466,487 | B2 | 11/2019 | Blum et al. | |
| 10,772,374 | B2 * | 9/2020 | Shida | G02B 7/023 |
| 11,372,253 | B2 * | 6/2022 | Deliz Centeno | G02B 27/017 |
| 11,402,660 | B1 * | 8/2022 | Hoye | G02C 5/2263 |
| 2005/0270480 | A1 * | 12/2005 | Curci | G02C 5/04 351/111 |
| 2011/0273365 | A1 * | 11/2011 | West | G02B 27/0176 29/428 |
| 2012/0057120 | A1 * | 3/2012 | Ogren | G02C 5/12 351/136 |
| 2016/0054570 | A1 * | 2/2016 | Bosveld | A41D 20/00 2/209.3 |
| 2017/0299863 | A1 * | 10/2017 | Luo | G02C 5/2209 |
| 2018/0095294 | A1 * | 4/2018 | Johnson | G02C 5/006 |
| 2018/0203240 | A1 | 7/2018 | Jones et al. | |
| 2020/0050018 | A1 * | 2/2020 | Matera | G02C 5/10 |
| 2021/0124175 | A1 * | 4/2021 | Lee | G06F 1/3206 |
| 2021/0255479 | A1 * | 8/2021 | Lopez | G02C 5/2263 |
| 2021/0318554 | A1 * | 10/2021 | Yang | G02C 5/16 |

FOREIGN PATENT DOCUMENTS

| | | | |
|---|---|---|---|
| KR | 10-2016-0085721 A | | 7/2016 |
| TW | M377606 U | | 4/2010 |
| WO | WO-1992015916 A | * | 9/1992 |
| WO | 2016162901 A1 | | 10/2016 |

OTHER PUBLICATIONS

Jovis Joseph Aloor et al., Design of VR Headset Using Augmented Reality, International Conference on Electrical, Electronics, and Optimization Techniques 1-5 (2016). (Year: 2016).*

Zach Weisman, Self-adjusting Lenses for VR and AR, 2016, pp. 1-13 [online]m [retrieved May 13, 2023], retrieved from the Internet <URL: https://medium.com/the-how-and-why-of-our-world/self-adjusting-lenses-for-vr-and-ar-1ef97037889d >. (Year: 2016).*

Daniel Porter, Learn the Nine Essential Parts of Eyeglasses, 2017, pp. 1-4 [online], [retrieved Aug. 9, 2022], retrieved from the Internet <URL: https://www.aao.org/eye-health/glasses-contacts/learn-nine-essential-parts-of-eyeglasses>. (Year: 2017).*

Clutches and Brakes, pp. 1-41 [online], [retrieved May 16, 2023], retrieved from the Internet <URL: https://www.gecdahod.ac.in/med/material/clutch_brakes_example_practice.pdf>. (Year: 2023).*

Jannick Rolland et al., Head-Mounted Display Systems, 2005, pp. 1-14 [online], [retrieved Nov. 14, 2023], retrieved from the Internet <URL: https://citeseerx.ist.psu.edu/document?repid=rep1&type=pdf&doi=dc155b2850364f8c7dc5ff2994166d8a0e84673b>. (Year: 2005).*

Friction Hinges, 2016, one page [online], [retrieved Nov. 13, 2023], retrieved from the Internet <URL: https://web.archive.org/web/20160330150405/https://www.hingemanufacturers.org/friction-hinges/#read>. (Year: 2016).*

Jordan McDowell, The ABC's of Torque Hinges, 2022, pp. 1-11 [online], [retrieved 2023-11-13], retrieved from Internet <URL: https://www.sugatsune.com/the-abcs-of-torque hinges/#:~:text=A%20torque%20hinge%2C%20also%20known%20as%20a%20friction,resistance%2C%20which%20prevents%20a%20compo-nent% . . . >. (Year: 2022).*

L. Gaul et al., The Role of Friction in Mechanical Joints, 54 Appl. Mech. Review 93-106 (2001). (Year: 2001).*

John Erbicella, Axis of Rotation, 2019, pp. 1-15 [online], [retrieved Feb. 19, 2024], retrieved from the Internet <URL: https://bentlybearings.com/axis-of-rotation/>. (Year: 2019).*

Celia Vimont, How to Choose the Glasses Frame Material That's Right for You, 2020, pp. 1-4 [online], [retrieved Mar. 8, 2024], retrieved from the Internet <URL: https://www.aao.org/eye-health/glasses-contracts/eyeglass-frame-materials>. (Year: 2020).*

Hinges for Eyeglasses: What are the Different Types?, 2020, pp. 1-5 [online], [retrieved Aug. 14, 2024], retrieved from the Internet <URL: https://web.archive.org/web/20201126211649/https://www.framesdirect.com/knowledge-center/glasses-hinges-types>. (Year: 2020).*

* cited by examiner

5360

5361

5362

5363

5368

5370

5367

5366

5370

5369

5364

FRAME ASSEMBLY FOR ELECTRONIC DEVICE

CROSS-REFERENCE TO RELATED APPLICATIONS

This application claims the benefit of U.S. Provisional Application No. 63/022,004, filed on May 8, 2020, the content of which is hereby incorporated by reference in its entirety for all purposes.

FIELD

The present disclosure relates generally to the field of electronic devices that are worn on a user's head.

BACKGROUND

Head-mounted devices that display computer-generated reality content include display devices and optics that guide light from the display devices to a user's eyes. A support structure holds the device in place with respect to the user's head. Some support devices are not difficult to adjust or are not sufficiently adjustable to accommodate users with a wide variety of head shapes and head sized.

SUMMARY

One aspect of the disclosure is an electronic device. The electronic device includes a light-emitting display system, a frame portion, an arm portion, a lateral joint that is connected between the frame portion and the arm portion, and an elevational joint that is connected between the frame portion and the arm portion. The lateral joint is biased toward a neutral position and is movable away from the neutral position to define a lateral position of the arm portion with respect to the frame portion. The elevational joint is adjustable to define an elevational position of the arm portion with respect to the frame portion.

In some implementations of the electronic device, the lateral joint is a flexing joint. In some implementations of the electronic device, the lateral joint is a pivoting joint. In some implementations of the electronic device, the elevational joint is a rotational joint. In some implementations of the electronic device, the elevational joint is a translational joint.

In some implementations of the electronic device, the lateral joint is connected to the arm portion by a fixed connection and the lateral joint is connected to the frame portion by the elevational joint. In some implementations of the electronic device, the lateral joint is connected to the frame portion by a fixed connection and the lateral joint is connected to the arm portion by the elevational joint. In some implementations of the electronic device, the lateral joint is connected to the frame portion by a fixed connection, the lateral joint is connected to an intermediate portion by a fixed connection, and the intermediate portion is connected to the arm portion by the elevational joint.

In some implementations of the electronic device, the elevational joint includes a friction element that is configured to restrain rotation until an external force that is sufficient to overcome the friction element is applied to the elevational joint. In some implementations of the electronic device, the elevational joint includes a releasable restraining mechanism that restrains rotation in a locked position and allows rotation in an unlocked position. In some implementations of the electronic device, wherein the elevational joint includes a flexible connector structure that is connectable to limit rotation of the elevational joint. In some implementations of the electronic device, the elevational joint includes a detent structure that is configured to allow the elevational joint to pivot between detent positions and to hold the elevational joint at predetermined angular orientations.

In some implementations of the electronic device, the elevational joint includes a magnetic connector assembly that allows the elevational joint to be moved between a first elevational position and a second elevational position. In some implementations of the electronic device, the elevational joint is a translating joint that is able to slide between a first elevational position and a second elevational position. In some implementations of the electronic device, the elevational joint includes a track that extends in an elevational direction.

In some implementations of the electronic device, the elevational joint includes a cable that extends between the arm portion and the frame portion and a cable clamp that is able to engage the cable to restrain motion of the elevational joint. In some implementations of the electronic device, the elevational joint includes a slot and a clamp that extends through the slot and is engageable to restrain motion of the elevational joint. In some implementations of the electronic device, wherein the elevational joint includes a clutch, the clutch is able to restrain motion of the elevational joint, and the clutch is able to slip to allow motion of the elevational joint in response to an external force of sufficient magnitude to overcome a holding force of the clutch.

In some implementations, the electronic device also includes a lens that is supported by the frame portion, sensors, a computing device that is configured to generate content using the sensors, a light-emitting display system that is configured to cause display of the content as emitted light, an optical system that is configured to present the emitted light in a user-perceivable form, and a power source that supplies power to the computing device and the light-emitting display system.

Another aspect of the disclosure is an electronic device that includes a frame portion, a lens that is supported by the frame portion, sensors, a computing device that is configured to generate content using the sensors, a light-emitting display system that is configured to cause display of the content as emitted light, an optical system that is configured to present the emitted light in a user-perceivable form, a power source that supplies power to the computing device and the light-emitting display system, an arm portion, a lateral joint, and an elevational joint. The lateral joint is connected between the frame portion and the arm portion. The elevational joint is connected between the frame portion and the arm portion, wherein the elevational joint includes a friction element that is configured to restrain rotation until an external force that is sufficient to overcome the friction element is applied to the elevational joint.

In some implementations of the electronic device, the lateral joint is biased toward a neutral position and is movable away from the neutral position to define a lateral position of the arm portion with respect to the frame portion the elevational joint is adjustable to define an elevational position of the arm portion with respect to the frame portion. The lateral joint may be at least one of a flexing joint, a pivoting joint, a rotational joint, or a translational joint.

Another aspect of the disclosure is an electronic device that includes a computing device, a light-emitting display system, and an optical system, wherein the computing device, the light-emitting display system, and the optical system cooperate to cause display of content that can be perceived by a user. The electronic device also includes a frame assembly that includes a frame portion, a first arm portion, and a second arm portion. Each of the first arm portion and the second arm portion are connected to the frame portion by a lateral joint and an elevational joint. Each lateral joint allows adjustment of a lateral position of a respective one of the first arm portion and the second arm portion. Each elevational joint allows adjustment of an elevation position of a respective one of the first arm portion and the second arm portion. Each lateral joint is connected to a respective one of the first arm portion and the second arm portion by a fixed connection and each lateral joint is connected to the frame portion by the elevational joint.

In some implementations of the electronic device, the lateral joint is a flexing joint. In some implementations of the electronic device, the lateral joint is a pivoting joint. In some implementations of the electronic device, the elevational joint is a rotational joint. In some implementations of the electronic device, the elevational joint is a translational joint. In some implementations of the electronic device, the elevational joint includes a friction element that is configured to restrain rotation until an external force that is sufficient to overcome the friction element is applied to the elevational joint.

Another aspect of the disclosure is a fixed joint for a frame assembly that includes a first part and a second part. The fixed joint includes a first fastener that connects the first part to the second part, a second fastener that connects the first part to the second part, and a wedge plate that is connected between the first fastener and the second fastener to engage the first fastener and the second fastener so that the wedge plate restrains rotation of the first fastener and the second fastener with respect to the first part and the second part.

DETAILED DESCRIPTION

The disclosure herein relates to electronic devices that are worn on a user's head. These electronic devices may incorporate near-eye displays that are used to show content to the user. The content shown may be part of a computer generated reality experience.

The devices that are described herein include frame assemblies that are able to be adjusted to provide a comfortable fit for a wide variety of users. The devices that are described herein may also help the user position the device so that their eyes are located in the appropriate areas relative to the display devices to allow visual content to be perceived at the intended visual quality. The devices that are described herein may also help the user position the device so that audio components of the device are at appropriate locations relative to the user's ears to allow audio content to be perceived at the intended audio quality. The frame assemblies that are described herein include lateral joints that allow for adjustment of a lateral position and elevational joints that allow for adjustment of an elevational position.

Figure 1:
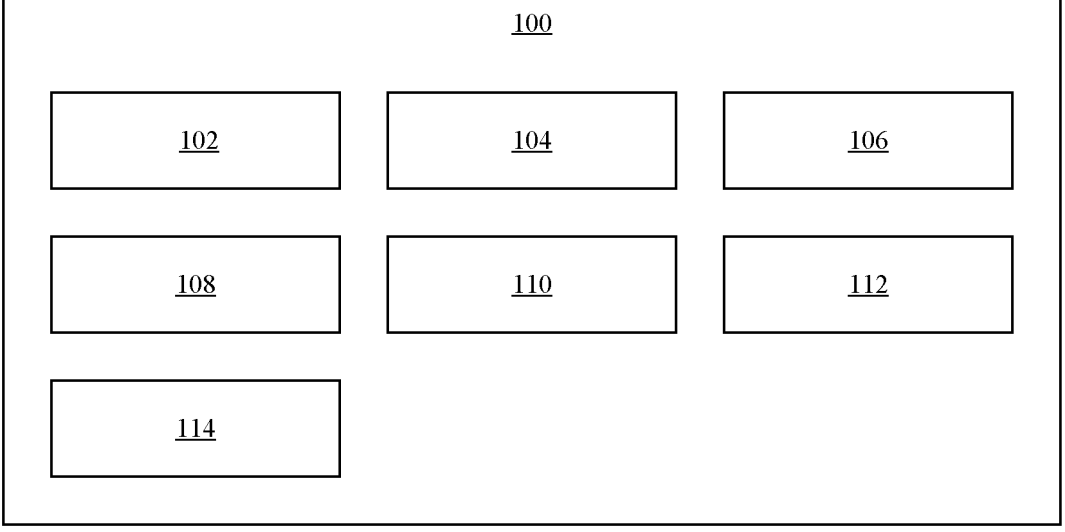
FIG. 1 is a block diagram that shows an example of a hardware configuration for an electronic device.

FIG. 1 is a block diagram that shows an example of a hardware configuration for an electronic device 100. The electronic device 100 is intended to be worn on the head of a user and includes components that are configured to display content to the user using a near-eye display system.

The electronic device 100 includes a frame assembly 102, a lens 104, a computing device 106, sensors 108, a light-emitting display system 110, an optical system 112, and a power source 114. Other components may be included in the electronic device 100. Components of the electronic device 100, including the computing device 106, the sensors 108, the light-emitting display system 110, and/or the optical system 112 cooperate to cause display of content that can be perceived by a user (e.g., in a user-perceivable form).

Components that are included in the electronic device 100 may be configured to track motion of parts of the user's body, such as the user's head and hands. Motion tracking information that is obtained by components of the head-mounted device can be utilized as inputs that control aspects of the generation and display of the content to the user, so that the content displayed to the user can be part of a CGR experience in which the user is able to view and interact with virtual environments and virtual objects. As will be explained further herein, CGR experiences include display of computer-generated content independent of the surrounding physical environment (e.g., virtual reality), and display of computer generated content that is overlaid relative to the surrounding physical environment (e.g., augmented reality).

The frame assembly 102 supports the electronic device 100 with respect to the user and allows it to be worn. The frame assembly 102 also functions as a structure to which other components of the electronic device 100 may be attached. The frame assembly 102 also functions to restrain movement of the electronic device with respect to the user's head. This allows the frame assembly 102 to hold certain components of the electronic device 100 in consistent positions with respect to the user's head.

As one example, the optical system 112 may be configured to project content to a three-dimensional region in space that is referred to as an eye box. The eye box is the area where the user's pupil can be positioned so that the user will be able to see the content that is displayed by the electronic device 100 with acceptable visual clarity. Initially, the user adjusts the electronic device 100 to position themselves (e.g., to position their pupils) correctly with respect to the eye box defined by the optical system 112. The frame assembly 102 is configured to maintain this positional relationship by restraining motion of the electronic device 100 with respect to the user's head.

As another example, the electronic device 100 may include audio components (e.g., loudspeaker) that are configured to output audio content and are designed to provide optimal audio quality when positioned within a particular region adjacent to the user's ear. The user may further adjust the frame assembly 102 to position the audio components at a desired location, and the frame assembly 102 is configured to maintain this positional relationship by restraining motion of the electronic device 100 with respect to the user's head.

The frame assembly 102 may be a single part structure or a multiple part structure. The frame assembly 102 may include rigid components, flexible components, joints, adjustment features, and/or other structures. Specification implementations of the frame assembly 102 will be discussed herein.

The electronic device 100 includes the lens 104 (or two lenses, in some implementations) to define an eyeglasses-style configuration for the electronic device. The lens 104 is a transparent, see-through component that is configured to be positioned in front of the user's eyes. Some implementations may include a pair of lenses, each positioned in front of one of the user's eyes. The user is able to see through the lens 104 and see the natural environment. The lens 104 may be formed from any see-through material, such as glass or plastic. The lens 104 may have a configuration that converges, diverges, or otherwise modifies the directions of the rays of light that pass through it, or the lens 104 may lack such a configuration and instead allow light to pass through it without significantly modifying the directions of the rays of light. In some implementations, the lens 104 is a corrective lens that is configured to correct the vision of the user by incorporating a lens shape that corresponds to the needed correction, for example, to correct for nearsightedness, farsightedness, or astigmatism.

The computing device 106 is operable to store, load, and execute computer program instructions. When executed by the computing device 106, the computer program instructions cause the computing device to perform operations.

The operations that can be performed by the computing device 106 may include obtaining information. Examples of obtaining information include accessing the information from a storage device, accessing the information from short-term memory, receiving a wired or wireless transmission that includes the information, receiving signals from an input device that represent user inputs, and receiving signals from the sensors 108 that represent observations made by the sensors 108.

The operations that can be performed by the computing device 106 may include making a determination. Examples of making a determination include comparing a value to a threshold, comparing states to conditions, and making a calculation using data of any type.

The operations that can be performed by the computing device 106 may also include transmitting information, for example, to a remote system.

The operations that can be performed by the computing device 106 may also include outputting a signal to control a component. One example of a signal to control a component is a signal that causes a sensor to take a measurement. Another example of a signal to control a component is a signal that causes a camera to capture an image. Another example of a signal to control a component is a signal that causes operator of an actuator, such as by commanding the actuator to start moving, stop moving, set a speed value, set a torque value, or move to a particular position that is specified by the signal.

The operations that can be performed by the computing device 106 may also include generating content for display to the user. The content can be generated using stored program instructions and assets (e.g., images, three-dimensional meshes, etc.). The content can be generated in dependence on information such as user inputs and signals received from the sensors 108. As one example, the content can be generated in dependence on a current position, orientation, and/or motion of the electronic device 100, as measured by the sensors 108. As another example, the content can be generated in dependence on the locations and geometric configurations of physical structures that are located in the environment around the user.

The operations that can be performed by the computing device 106 may also include outputting a display signal that causes a display component to display content to the user. The signal may be output, for example, to the light-emitting display system 110 which causes the content to be displayed in a manner that can be perceived by the user in cooperation with the optical system 112.

To execute program instructions, the computing device 106 may include a processor in the form of one or more conventional devices and/or more or more special-purpose devices. Implementations may include one or more central processing units, one or more graphics processing units, one or more application specific integrated circuits, and/or one or more field programmable gate arrays. Short-term storage may be provided in the form of conventional memory devices that are included in the computing device 106, such as one or more volatile, high-speed, short-term information storage devices such as random-access memory modules. Long-term storage of computer program instructions and other data may be provided by inclusion of a non-volatile information storage device in the computing device 106, such as a flash memory module, a hard drive, or a solid-state drive.

The sensors 108 are components that are incorporated in the electronic device 100 to generate sensor output signals to are used as inputs by the computing device 106 for use in generating content to be displayed to the user, and/or for performing other functions, as will be described herein. The information that is generated by the sensors 108 is provided to other components of the electronic device 100, such as the computing device 106, as inputs.

The sensors 108 may include components that facilitate motion tracking (e.g., head tracking, hand tracking, foot tracking, and/or controller tracking in six degrees of freedom). Motion tracking can be performed, as examples, using an inertial measurement unit (e.g., including accelerometers, gyroscopes, and magnetometers), using images from cameras, and or using three-dimensional sensor outputs (e.g., depth images or point clouds).

The sensors 108 may also include additional sensors that are used by the device to generate and/or enhance the user's experience in any way. The sensors 108 may include conventional components such as cameras, infrared cameras, infrared emitters, depth cameras, structured-light sensing devices, accelerometers, gyroscopes, and magnetometers. The sensors 108 may also include biometric sensors that are operable to physical or physiological features of a person, for example, for use in user identification and authorization. Biometric sensors may include fingerprint scanners, retinal scanners, and face scanners (e.g., two-dimensional and three-dimensional scanning components operable to obtain image and/or three-dimensional surface representations). The sensors 108 may also include tension sensors or other force sensing components that are able to output signals representing the forces experienced in portions of the frame assembly 102 in order to adjust the fit of portions of the frame assembly 102 using actuators. Other types of devices can be incorporated in the sensors 108.

The light-emitting display system 110 is connected to the frame assembly 102 and functions to display content to the user in the form of emitted light that is output by the light-emitting display system 110 and is directed toward the user's eyes by the optical system 112. The light-emitting display system 110 includes one or more light emitting display devices. In one implementation, a single light emitting display device outputs content to be perceived by both of the user's eyes. In another implementation, a first light-emitting display device outputs content to be perceived by the user's left eye and a second light-emitting display device outputs content to be perceived by the user's right eye.

The one or more light-emitting display devices of the light-emitting display system 110 may be video displays or projectors of any suitable type that are able to output images in response to a signal that is received from the computing device 106. The light-emitting display devices may be of the type that selectively illuminate individual display elements according to a color and intensity in accordance with pixel values from an image. As examples, the display device may be implemented using a liquid-crystal display (LCD) device, a light-emitting diode (LED) display device, a liquid crystal on silicon (LCoS) display device, an organic light-emitting diode (OLED) display device, or any other suitable type of display device. The light-emitting display system 110 may include multiple individual display devices (e.g., two display screens, projectors, or other display devices arranged side-by-side in correspondence to the user's left eye and the user's right eye).

The optical system 112 is associated with the light-emitting display system 110 so that light that is emitted by components of the light-emitting display system 110 is incident on portions of the optical system 112. The optical system 112 directs the emitted light from the light-emitting display system 110 to the user's eyes. The optical system is connected to the frame assembly 102 such that portions of the optical system 112 are positioned adjacent to the user's eyes. In one implementation, portions of the optical system 112 are positioned adjacent to the lens 104. In another implementation, portions of the optical system are located in and/or integrated with the lens 104.

In some implementations, the optical system 112 may be configured isolate the emitted light from environment light (e.g., as in a virtual reality type system), so that a scene perceived by the user is defined only by the emitted light and not by the environment light. In some implementations, the optical system 112 may be configured to combine the emitted light with environmental light so that the scene perceived by the user is defined by the emitted light and the environment light. In some implementations, the optical system 112 may combine the emitted light and the environment light so that a spatial correspondence is established between the emitted light and the environmental light to define the scene that is perceived by the user (e.g., as in an augmented reality type system). The optical system 112 may include lenses, reflectors, polarizers, waveguides, filters, optical combiners, and/or other optical components.

The power source 114 supplies electrical power to components of the electronic device 100. In some implementations, the power source 114 is a wired connection to electrical power. In some implementations, the power source 114 may include a battery of any suitable type, such as a rechargeable battery. In implementations that include a battery, the electronic device 100 may include components that facilitate wired or wireless recharging. The power source 114 and related components may be connected to and supported by the frame assembly 102 of the electronic device 100.

In some implementations of the electronic device 100, some or all of these components may be included in a separate device that is removable. For example, any or all of the computing device 106, the sensors 108, and the light-emitting display system 110 may be incorporated in a device such as a smart phone that is connected (e.g., by docking) to the other portions of the electronic device 100.

In some implementations of the electronic device 100, computing device 106 is omitted, and the corresponding functions are performed by an external device that communicates with the electronic device 100. In such an implementation, the electronic device 100 may include components that support a data transfer connection with the external device using a wired connection or a wireless connection.

Figure 2:
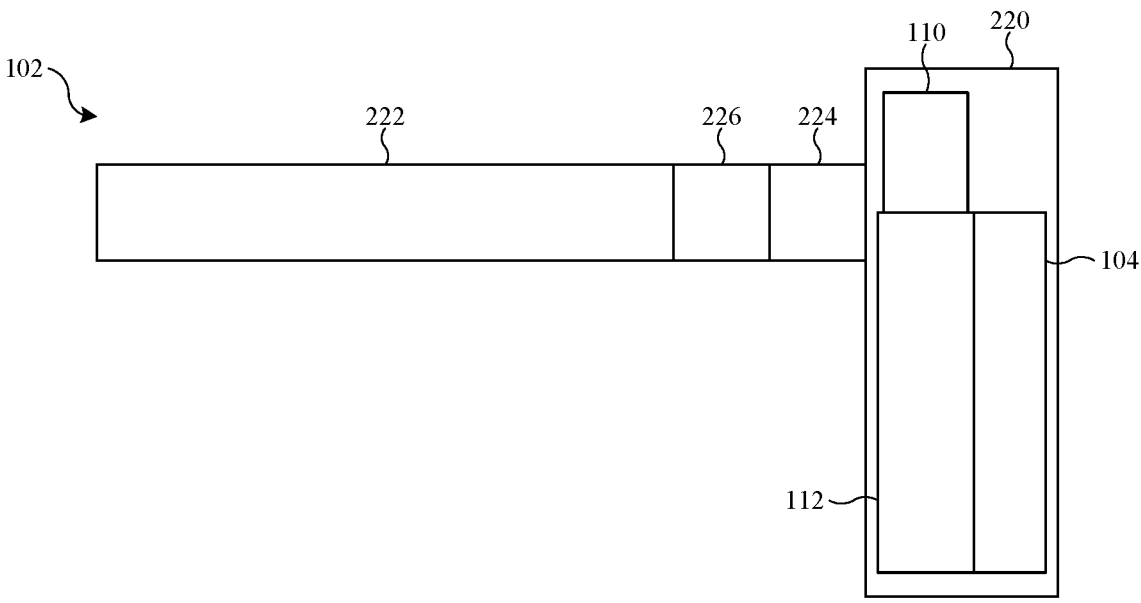
FIG. 2 is a side-view illustration that shows a frame assembly of the electronic device.
Figure 3:
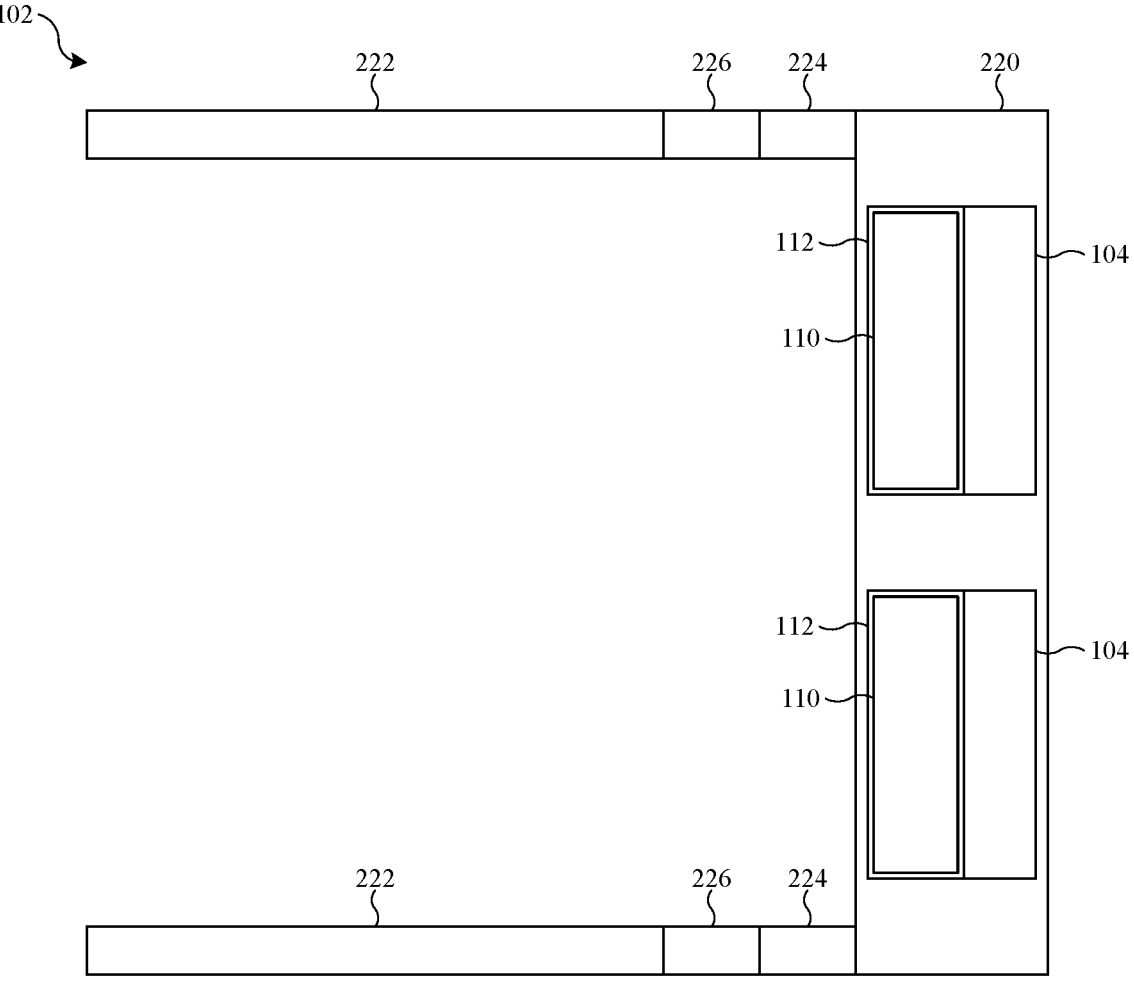
FIG. 3 is a top-view illustration that shows the frame assembly of the electronic device.

FIG. 2 is a side-view illustration that shows the frame assembly 102 of the electronic device 100, and FIG. 3 is a top-view illustration that shows the frame assembly 102 of the electronic device 100. In the illustrated example, the frame assembly 102 includes a frame portion 220 (which may also be referred to as a main portion of the frame assembly 102) and arm portions 222 that cooperate to define an eyeglasses-style configuration for the frame assembly 102. The frame portion 220 is intended to be positioned near the user's eyes and extend across the user's face when worn. The arm portions 222 extend from each lateral end of the frame portion 220, are intended to be positioned at the sides of the user's head, and may engage the user's ears.

The lens 104, the light-emitting display system 110, and the optical system 112 are connected to the frame portion 220 of the frame assembly 102. In the illustrated example, there are two lenses, each of which is associated with separate display components and optical components. Other configurations are contemplated. In addition, some components may be located in the arm portions 222. For example, the light-emitting display system 110 could include projectors that are connected to the arm portions 222 and project emitted light toward the frame portion 220 (e.g., such that it is incident upon components of the optical system 112 that are connected to and supported by the frame portion 220).

Each arm portion 222 is connected to the frame portion 220 by a first joint 224 and a second joint 226. The first joint 224 and the second joint 226 allow for adjustability of the geometric configuration of the frame assembly 102 so that the electronic device 100 may be comfortably and securely worn by many users across a wide range of head sizes and geometries. Thus, the frame assembly 102 may include a frame portion, a first arm portion that that is connected to the frame portion by a first joint and a second joint, and a second arm portion that is connected to the frame portion by a third joint and a fourth joint.

In the illustrated example, the frame portion 220 is connected to the first joint 224, the first joint 224 is connected to the second joint 226, and the second joint 226 is connected to the arm portion 222. In some implementations, an intermediate portion is located between the first joint 224 and the second joint 226 and serves as a connecting structure between first joint 224 and the second joint 226 with each of the first joint 224 and the second joint 226 being connected to the intermediate portion.

The first joint 224 and the second joint 226 define a joint pair, with each of the joints in the joint pair allowing a different type of motion. Each joint pair includes a lateral joint and an elevational joint. In one implementation, the first joint 224 is a lateral joint, and the second joint 226 is an elevational joint. In another implementation, the first joint 224 is an elevational joint and the second joint 226 is a lateral joint.

The joint pair includes a lateral joint that allows movement of the arm portion 222 in a lateral direction, which is defined herein as a side-to-side or right-left direction relative to the head of the user when the electronic device 100 is worn on the user's head with the frame portion 220 of the frame assembly 102 positioned near the user's eyes. As an example, the lateral joint of each joint pair may allow the arm portions 222 of the frame assembly 102 to pivot outward, either by pivoting on a fixed axis or by flexure of a flexible element, in order to accommodate the shape and size of the user's head. The lateral joint may be a, as example, flexing joint or a pivoting joint.

The lateral joint of each joint pair is biased toward a neutral position. As one example, the lateral joint may be a spring-biased rotational joint (e.g., a spring and a pin). As another example, the lateral joint may be defined by a flexible material that is biased toward a neutral position by its own material properties (e.g., thin sheet steel that may be bent but is biased toward a straight configuration). Thus, the lateral joint may be moved away from the neutral position by an external force and, when the external force is removed, the lateral joint is biased back toward the neutral position.

In some implementations, the lateral joint of each joint pair allows the arm portion 222 to be moved between a folded position and an unfolded position with respect to the frame portion 220 of the frame assembly 102. In other implementations, the lateral joint of each joint pair does not allow movement of the arm portion 222 between the folded position and the unfolded position and, optionally, an additional joint may be included in the frame assembly to allow the arm portion 222 to be moved between the folded position and the unfolded position.

The joint pair also includes an elevational joint that allows movement of the arm portion 222 in an elevational direction, which is defined herein as an up-down direction relative to the head of the user when the electronic device 100 is worn on the user's head with the frame portion 220 of the frame assembly 102 positioned near the user's eyes. As examples, the elevational joint may be a rotating (e.g., pivoting) joint or a translational joint.

The elevational joint of each joint pair is not biased toward a particular position. Instead, the elevational joint of each joint pair allows adjustment to a particular position that is set by the user, and maintains that position until lateral adjusted differently. As one example, the elevational joint may maintain its position as a result of internal friction in the elevational joint. As another example the elevational joint may maintain its position by engagement of a securing structure that maintains the elevational joint in a particular position until it is later released.

Figure 4:
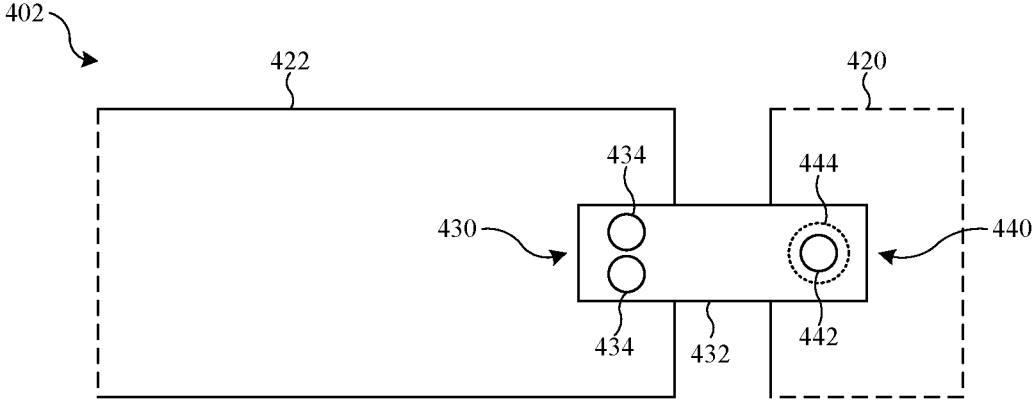
FIG. 4 is a side view illustration showing part of a frame assembly according to a first example implementation in a first elevational position.
Figure 5:
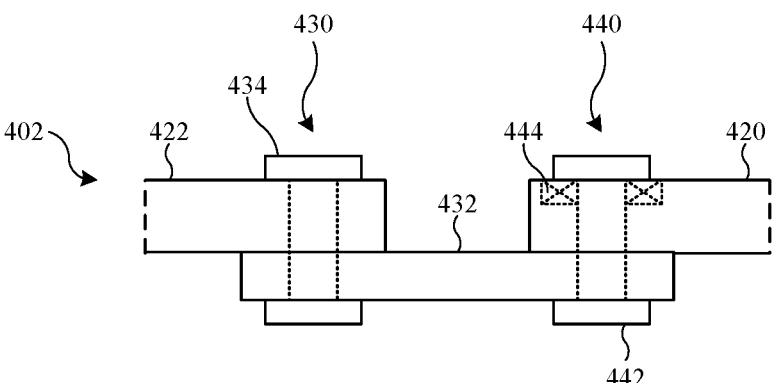
FIG. 5 is a top view illustration showing the part of the frame assembly of FIG. 4 in a first lateral position.
Figure 6:
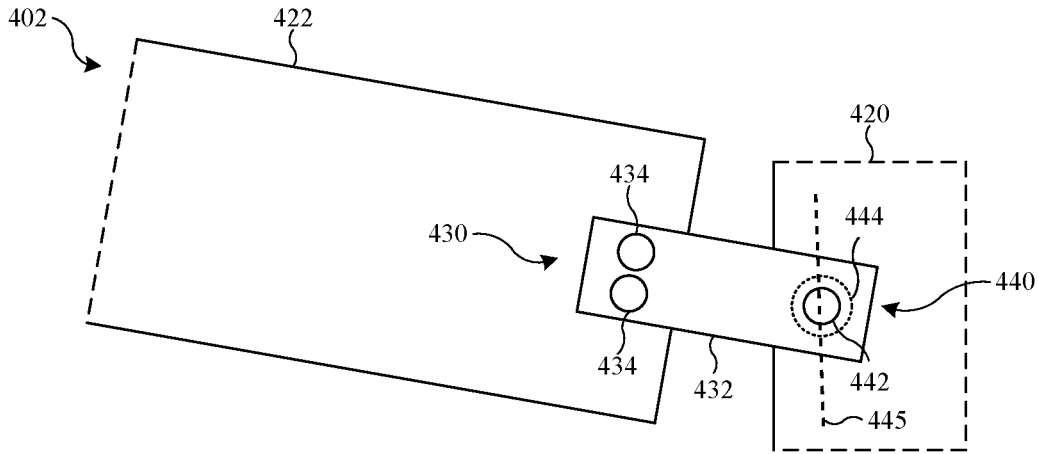
FIG. 6 is a side view illustration showing the part of the frame assembly of FIG. 4 in a second elevational position.
Figure 7:
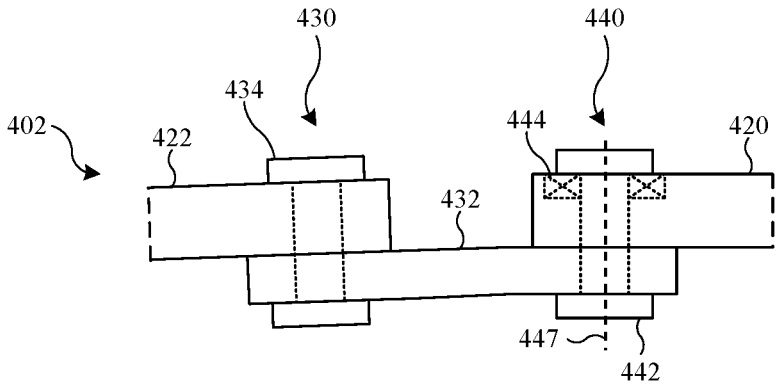
FIG. 7 is a top view illustration showing the part of the frame assembly of FIG. 4 in a second lateral position.

FIG. 4 is a side view illustration showing part of a frame assembly 402 according to a first example implementation in a first elevational position, FIG. 5 is a top view illustration showing the part of the frame assembly 402 in a first lateral position, FIG. 6 is a side view illustration showing the part of the frame assembly 402 in a second elevational position, and FIG. 7 is a top view illustration showing the part of the frame assembly 402 in a second lateral position. The portions of the frame assembly 402 that are shown in FIGS. 4-7 may be incorporated in the electronic device 100 instead of corresponding portions of the frame assembly 102, including the first joint 224 and the second joint 226.

The frame assembly 402 includes a frame portion 420, an arm portion 422, a lateral joint 430, and an elevational joint 440. The description of the frame assembly 102 and its components is applicable to the frame assembly 402 and its components except as otherwise described herein.

The lateral joint 430 is connected to the arm portion 422 and to the elevational joint 440. The lateral joint 430 is a structure that allows for lateral motion and adjustment of the arm portion 422 with respect to the frame portion 420 in a lateral direction and/or angle around a generally up-down axis 445 (shown in FIG. 6). The lateral joint 430 is biased toward the first lateral position (FIG. 5), which is a neutral position of the lateral joint 430 that the lateral joint 430 returns to in the absence of an external force applied to the lateral joint 430 and/or the arm portion 422 of the frame assembly 402. The lateral joint 430 is movable away from the first lateral position in a first lateral direction and a second lateral direction (e.g., toward and away from the user's head). As an example, the lateral joint 430 can be moved away from the first lateral position to the second lateral position (FIG. 7) by application of an external force that causes deflection of the lateral joint 430.

In the illustrated example, the lateral joint 430 includes a flexible element 432 and a fixed connection to the arm portion 422 that is defined by pins 434. The flexible element 432 is a structure that is flexible in the lateral direction so that it is able to bend laterally and return to its neutral position (e.g., corresponding to the first lateral position) when an external force is removed. The flexible element 432 may be inflexible in other directions, such as the elevational direction. As one example, the flexible element 432 may be a thin, substantially planar, sheet metal (e.g., steel) structure oriented so that the lateral direction is substantially normal to the planar surfaces of the sheet metal structure.

The pins 434 (two pins in the illustrated implementation) extend through holes formed in the flexible element 432 and the arm portion 422 and are fixed in place in the holes by fasteners, crimping, or other structures or techniques. The pins 434 connect the flexible element 432 to the arm portion 422 so that the flexible element 432 is restrained from rotating with respect to the arm portion 422 to define the fixed connection of the lateral joint 430 to the arm portion 422. In the illustrated implementation, two of the pins 434 are used to resist rotation. Alternatively, a single pin could be provided with anti-rotation features (e.g., a square profile) to resist rotation.

The elevational joint 440 is connected to the lateral joint 430 and to the frame portion 420 of the frame assembly 402. The elevational joint 440 is a rotating joint. The elevational joint 440 connects the lateral joint 430 to the frame portion 420 of the frame assembly 402 so that the lateral joint and the arm portion 422 of the frame assembly 402 are able to rotate with respect to the frame portion 420 of the frame assembly 402 about an axis 447 (shown in FIG. 7).

The elevational joint 440 does not pivot freely, but instead is maintained in a particular angular orientation as a result of internal friction. The elevational joint 440 may be restrained from moving away from a first elevational position (FIG. 4) until a magnitude of a force applied to it (e.g., by the user) is greater than the internal friction, at which point the external force overcomes the internal friction and moves the elevational joint 440 away from the first elevational position, for example, to a second elevational position (FIG. 6).

In the illustrated example, the elevational joint 440 includes a pin 442 that extends through (e.g., into or completely through) holes that are formed in the flexible element 432 of the lateral joint 430 and the frame portion 420 of the frame assembly 402. The pin 442 may be secured against rotation with respect to the flexible element 432, for example, by geometric features, welding, brazing, adhesives, and/or other structures and/or techniques. The pin 442 is rotatable with respect to the frame portion 420 about the axis 447 (shown in FIG. 7). Internal friction of the elevational joint 440 may be present as a result of material properties of components such as the pin 442 and the frame portion 420 or may be enhanced by provision of a structure that is made from a high-friction material that acts on the pin 442 or associated structures to restrain rotation of the pin 442 until a sufficiently high external force is applied. In the illustrated example, a friction element 444 (e.g., a rubber bushing) is located in or on the frame portion 420 and contacts a surface (e.g., a peripheral shaft surface) of the pin 442 to restrain rotation of the pin 442 (and thus rotation of the elevational joint 440) until an external force that is sufficient to overcome the friction element 444 is applied. In some implementations, the electronic device includes an elevational joint that is connected to the arm portion 422, wherein the lateral joint 430 is connected to the arm portion 422 by the elevational joint, wherein the elevational joint is configured to rotate about a second axis that extends perpendicular to the first axis through the flexible element 432 to rotationally connect the arm portion 422 to the flexible element 432 of the lateral joint 430, wherein the first axis intersects the second axis, and wherein the elevational joint includes a friction element that is configured to restrain rotation of the arm portion 422 until an external force that is sufficient to overcome the friction element is applied to the elevational joint. In some implementations, the first axis intersects the second axis such that the first axis and the second axis are co-located.

Figure 8:
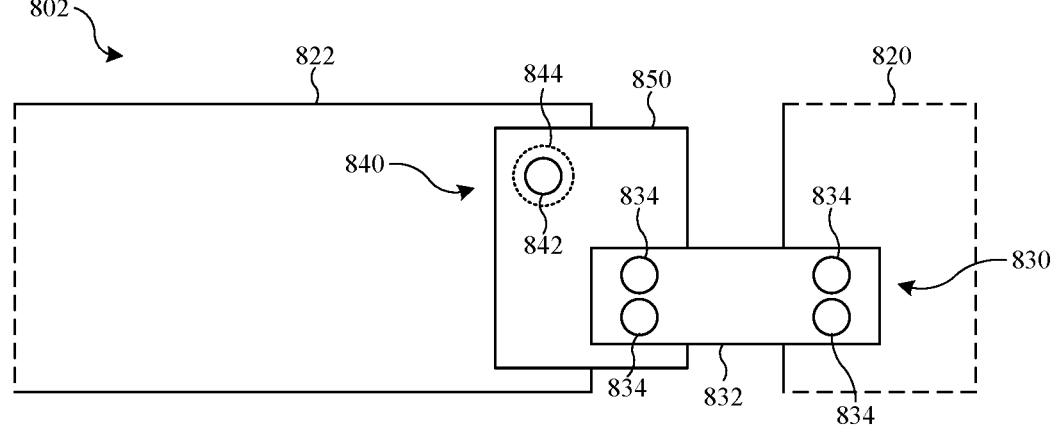
FIG. 8 is a side view illustration showing part of a frame assembly according to a second example implementation in a first elevational position.
Figure 9:
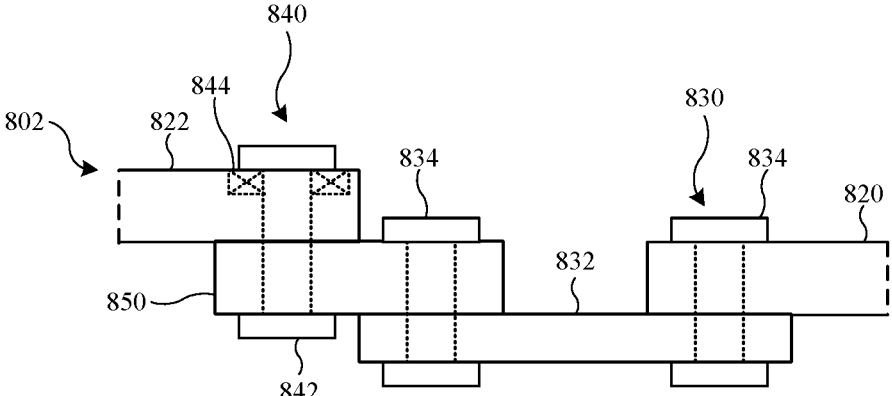
FIG. 9 is a top view illustration showing the part of the frame assembly of FIG. 8 in a first lateral position.
Figure 10:
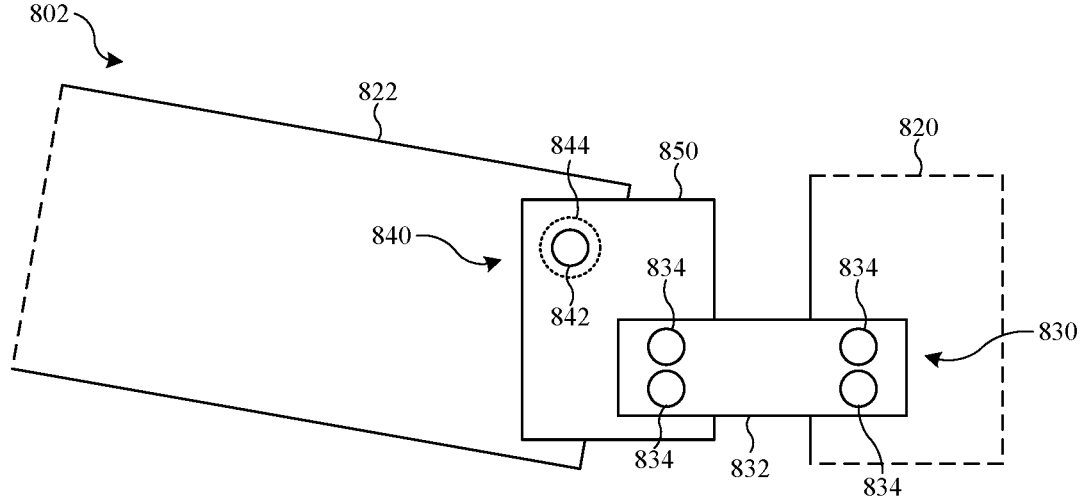
FIG. 10 is a side view illustration showing the part of the frame assembly of FIG. 8 in a second elevational position.
Figure 11:
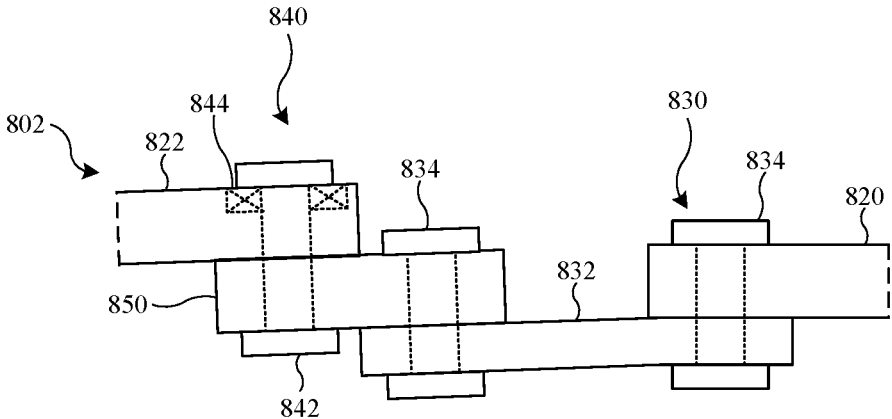
FIG. 11 is a top view illustration showing the part of the frame assembly of FIG. 8 in a second lateral position.

FIG. 8 is a side view illustration showing part of a frame assembly 802 according to a second example implementation in a first elevational position, FIG. 9 is a top view illustration showing the part of the frame assembly 802 in a first lateral position, FIG. 10 is a side view illustration showing the part of the frame assembly 802 in a second elevational position, and FIG. 11 is a top view illustration showing the part of the frame assembly 802 in a second lateral position. The portions of the frame assembly 802 that are shown in FIGS. 8-11 may be incorporated in the electronic device 100 instead of corresponding portions of the frame assembly 102, including the first joint 224 and the second joint 226.

The frame assembly 802 includes a frame portion 820, an arm portion 822, an intermediate portion 850, a lateral joint 830, and an elevational joint 840. The description of the frame assembly 102 and its components is applicable to the frame assembly 802 and its components except as otherwise described herein.

The intermediate portion 850 of the frame assembly 802 serves to separate the motion of the lateral joint 830 and the elevational joint 840. Thus, the joints are not directly connected to another, but instead are connected indirectly through an intermediate structure, which is the intermediate portion 850 in this implementation. The intermediate portion 850 may be a substantially rigid structure that is formed from any suitable material. The intermediate portion 850 may be connected to the lateral joint 830 and the elevational joint 840 (e.g., located between them) but not directly connected to other portions of the frame assembly 802 except through these connections.

The lateral joint 830 is connected to the frame portion 820 and to the intermediate portion 850. The lateral joint 830 is a structure that allows for lateral motion and adjustment of the arm portion 822 with respect to the frame portion 820 in a lateral direction and/or angle around a generally up-down axis. The lateral joint 830 is biased toward the first lateral position (FIG. 9), which is a neutral position of the lateral joint 830 that the lateral joint 830 returns to in the absence of an external force applied to the lateral joint 830, the intermediate portion 850, and/or the arm portion 822 of the frame assembly 802. The lateral joint 830 is movable away from the first lateral position in a first lateral direction and a second lateral direction (e.g., toward and away from the user's head). As an example, the lateral joint 830 can be moved away from the first lateral position to the second lateral position (FIG. 11) by application of an external force that causes deflection of the lateral joint 830.

In the illustrated example, the lateral joint 830 includes a flexible element 832, a fixed connection to the frame portion 820, and a fixed connection to the intermediate portion 850, each of which is defined by pins 834. The flexible element 832 is a structure that is flexible in the lateral direction so that it is able to bend laterally and return to its neutral position (e.g., corresponding to the first lateral position) when an external force is removed. The flexible element 832 may be inflexible in other directions, such as the elevational direction. As one example, the flexible element 832 may be a thin, substantially planar, sheet metal (e.g., steel) structure oriented so that the lateral direction is substantially normal to the planar surfaces of the sheet metal structure.

The pins 834 (two pins for each fixed connection in the illustrated implementation) extend through holes formed in the flexible element 832 and the frame portion 820 or the intermediate portion 850 and are fixed in place in the holes by fasteners, crimping, or other structures or techniques. The pins 834 connect the flexible element 832 to the frame portion 820 and the intermediate portion 850 so that the flexible element 832 is restrained from rotating with respect to the frame portion 820 and the intermediate portion 850 to define the fixed connections of the lateral joint 830 to the frame portion 820 and the intermediate portion 850. In the illustrated implementation, two of the pins 834 are used at each fixed connection to resist rotation. Alternatively, a single pin at each fixed connection could be provided with anti-rotation features (e.g., a square profile) to resist rotation.

The elevational joint 840 is connected to the intermediate portion 850 and to the arm portion 822 of the frame assembly 802. The elevational joint 840 is a rotating joint. The elevational joint 840 connects the arm portion 822 to the intermediate portion 850 of the frame assembly 802 and indirectly to the lateral joint 830 and the frame portion 820 of the frame assembly 802 so that the arm portion 822 of the frame assembly 802 is able to rotate with respect to the frame portion 820 of the frame assembly 802.

The elevational joint 840 does not pivot freely, but instead is maintained in a particular angular orientation as a result of internal friction. The elevational joint 840 may be restrained from moving away from a first elevational position (FIG. 8) until a magnitude of a force applied to it (e.g., by the user) is greater than the internal friction, at which point the external force overcomes the internal friction and moves the elevational joint 840 away from the first elevational position, for example, to a second elevational position (FIG. 10).

The elevational joint 840 includes a pin 842 that allows relative rotation of the arm portion 822 and the intermediate portion 850. In the illustrated example, the pin 842 extends through (e.g., into or completely through) holes that are formed in the intermediate portion 850 and the arm portion 822 of the frame assembly 802. The pin 842 may be, for example, secured against rotation with respect to the intermediate portion 850, for example, by geometric features, welding, brazing, adhesives, and/or other structures and/or techniques. The pin 842 is rotatable with respect to the arm portion 822. Internal friction of the elevational joint 840 may be present as a result of material properties of components such as the pin 842 and the arm portion 822 or may be enhanced by provision of a structure that is made from a high-friction material that acts on the pin 842 or associated structures to restrain rotation of the pin 842 until a sufficiently high external force is applied. In the illustrated example, a friction element 844 (e.g., a rubber bushing) is located in or on the arm portion 822 and contacts a surface (e.g., a peripheral shaft surface) of the pin 842 to restrain rotation of the pin 842 until a sufficiently high external force is applied.

Figure 12:
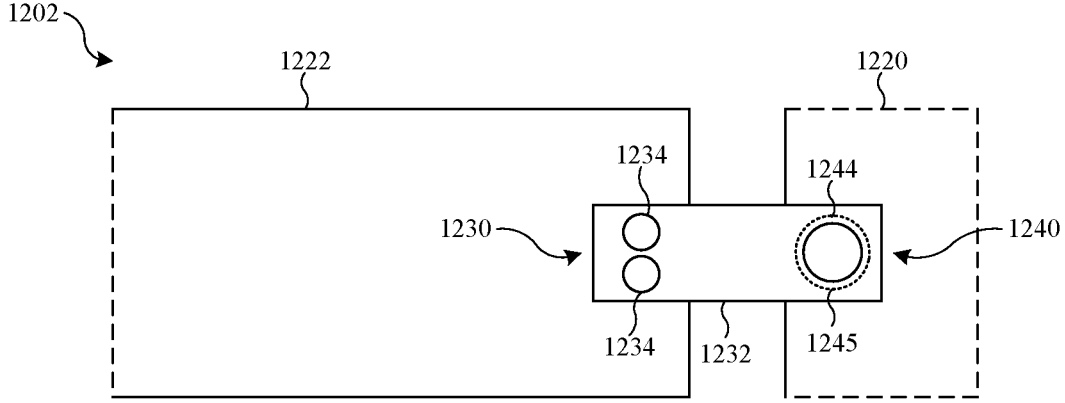
FIG. 12 is a side view illustration showing part of a frame assembly according to a third example implementation in a first elevational position.
Figure 13:
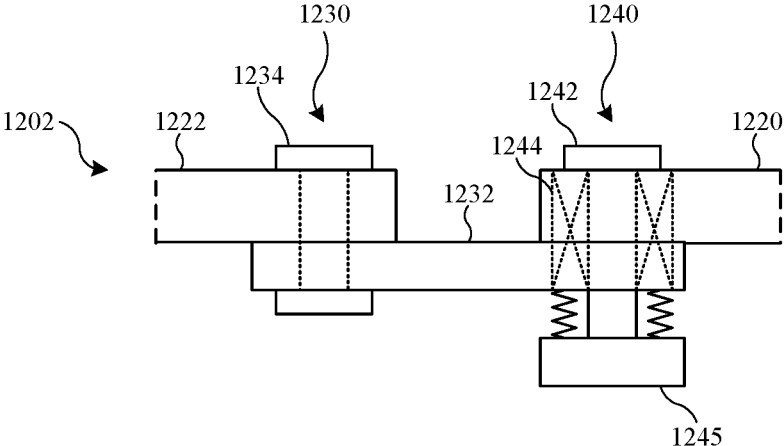
FIG. 13 is a top view illustration showing the part of the frame assembly of FIG. 12 in a first lateral position.
Figure 14:
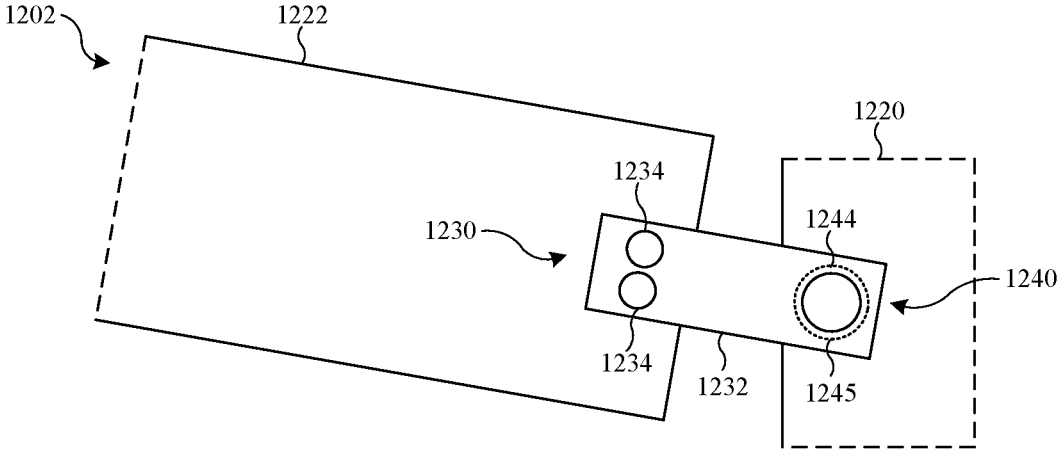
FIG. 14 is a side view illustration showing the part of the frame assembly of FIG. 12 in a second elevational position.
Figure 15:
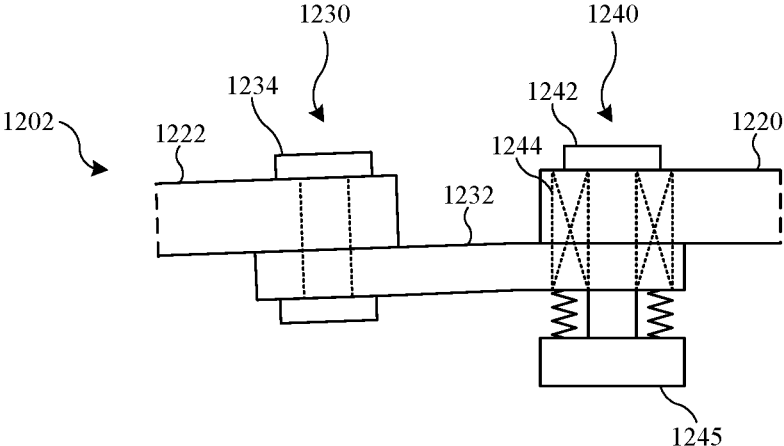
FIG. 15 is a top view illustration showing the part of the frame assembly of FIG. 12 in a second lateral position.

FIG. 12 is a side view illustration showing part of a frame assembly 1202 according to a third example implementation in a first elevational position, FIG. 13 is a top view illustration showing the part of the frame assembly 1202 in a first lateral position, FIG. 14 is a side view illustration showing the part of the frame assembly 1202 in a second elevational position, and FIG. 15 is a top view illustration showing the part of the frame assembly 1202 in a second lateral position. The portions of the frame assembly 1202 that are shown in FIGS. 12-15 may be incorporated in the electronic device 100 instead of corresponding portions of the frame assembly 102, including the first joint 224 and the second joint 226.

The frame assembly 1202 includes a frame portion 1220, an arm portion 1222, a lateral joint 1230, and an elevational joint 1240. The description of the frame assembly 102 and its components is applicable to the frame assembly 1202 and its components except as otherwise described herein.

The lateral joint 1230 is connected to the arm portion 1222 and to the elevational joint 1240. The lateral joint 1230 is a structure that allows for lateral motion and adjustment of the arm portion 1222 with respect to the frame portion 1220 in a lateral direction and/or angle around a generally up-down axis. The lateral joint 1230 is biased toward the first lateral position (FIG. 13), which is a neutral position of the lateral joint 1230 that the lateral joint 1230 returns to in the absence of an external force applied to the lateral joint 1230 and/or the arm portion 1222 of the frame assembly 1202. The lateral joint 1230 is movable away from the first lateral position in a first lateral direction and a second lateral direction (e.g., toward and away from the user's head). As an example, the lateral joint 1230 can be moved away from the first lateral position to the second lateral position (FIG. 15) by application of an external force that causes deflection of the lateral joint 1230.

In the illustrated example, the lateral joint 1230 includes a flexible element 1232 and a fixed connection to the arm portion 1222 that is defined by pins 1234. The flexible element 1232 is a structure that is flexible in the lateral direction so that it is able to bend laterally and return to its neutral position (e.g., corresponding to the first lateral position) when an external force is removed. The flexible element 1232 may be inflexible in other directions, such as the elevational direction. As one example, the flexible element 1232 may be a thin, substantially planar, sheet metal (e.g., steel) structure oriented so that the lateral direction is substantially normal to the planar surfaces of the sheet metal structure.

The pins 1234 (two pins in the illustrated implementation) extend through holes formed in the flexible element 1232 and the arm portion 1222 and are fixed in place in the holes by fasteners, crimping, or other structures or techniques. The pins 1234 connect the flexible element 1232 to the arm portion 1222 so that the flexible element 1232 is restrained from rotating with respect to the arm portion 1222 to define the fixed connection of the lateral joint 1230 to the arm portion 1222. In the illustrated implementation, two of the pins 1234 are used to resist rotation. Alternatively, a single pin could be provided with anti-rotation features (e.g., a square profile) to resist rotation.

The elevational joint 1240 is connected to the lateral joint 1230 and to the frame portion 1220 of the frame assembly 1202. The elevational joint 1240 is a rotating joint. The elevational joint 1240 connects the lateral joint 1230 to the frame portion 1220 of the frame assembly 1202 so that the lateral joint and the arm portion 1222 of the frame assembly 1202 are able to rotate with respect to the frame portion 1220 of the frame assembly 1202.

The elevational joint 1240 includes a releasable restraining mechanism that restrains rotation in a locked position and allows rotation in an unlocked position. When in the unlocked position, the elevational joint 1240 may be moved away from a first elevational position (FIG. 12) to a second elevational position (FIG. 14) where is maintained once the locked position is reestablished.

In the illustrated example, the elevational joint 1240 includes a pin 1242 that allows relative rotation of the frame portion 1220 of the frame assembly 1202 and the lateral joint 1230. The pin 1242 extends through (e.g., into or completely through) holes that are formed in the flexible element 1232 of the lateral joint 1230 and the frame portion 1220 of the frame assembly 1202. The pin 1242 may be secured against rotation with respect to the flexible element 1232, for example, by geometric features, welding, brazing, adhesives, and/or other structures and/or techniques. The pin 1242 is rotatable with respect to the frame portion 1220 in the unlocked position.

The releasable restraining mechanism of the elevational joint 1240 is engaged in the locked position to restrain rotation of the pin 1242 (e.g., with respect to the frame portion 1220) and can be released to define the unlocked position and allow rotation of the pin 1242. As an example, the releasable restraining mechanism may include anti-rotation features 1244 and a user operable button 1245. The anti-rotation features 1244 may be normally-engaged (e.g., by spring biasing) to establish the locked position when the user operable button 1245 is not depressed and may move so that the anti-rotation features 1244 are not engaged when the user operable button 1245 is depressed to establish the unlocked position.

Figure 16:
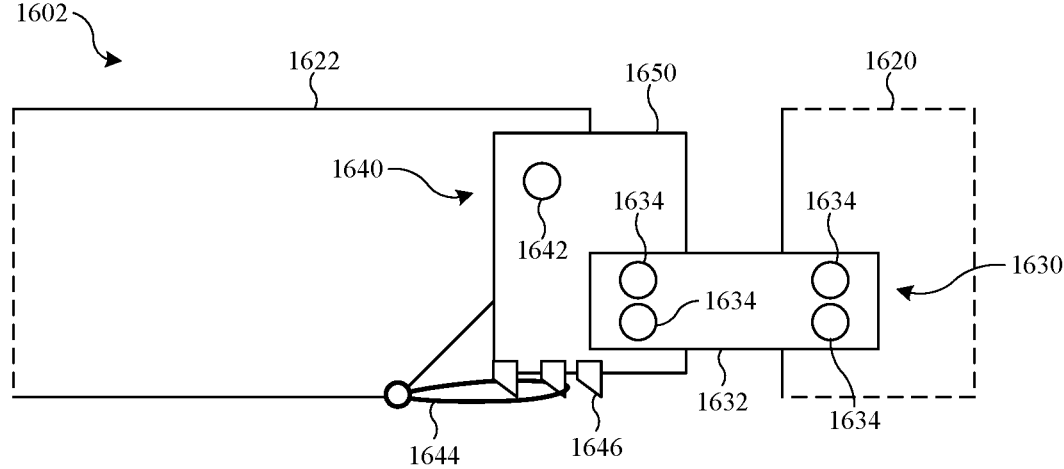
FIG. 16 is a side view illustration showing part of a frame assembly according to a fourth example implementation in a first elevational position.
Figure 17:
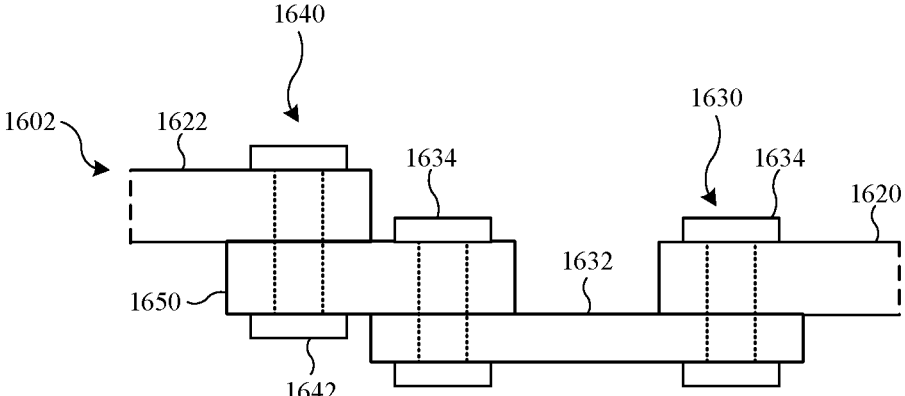
FIG. 17 is a top view illustration showing the part of the frame assembly of FIG. 16 in a first lateral position.
Figure 18:
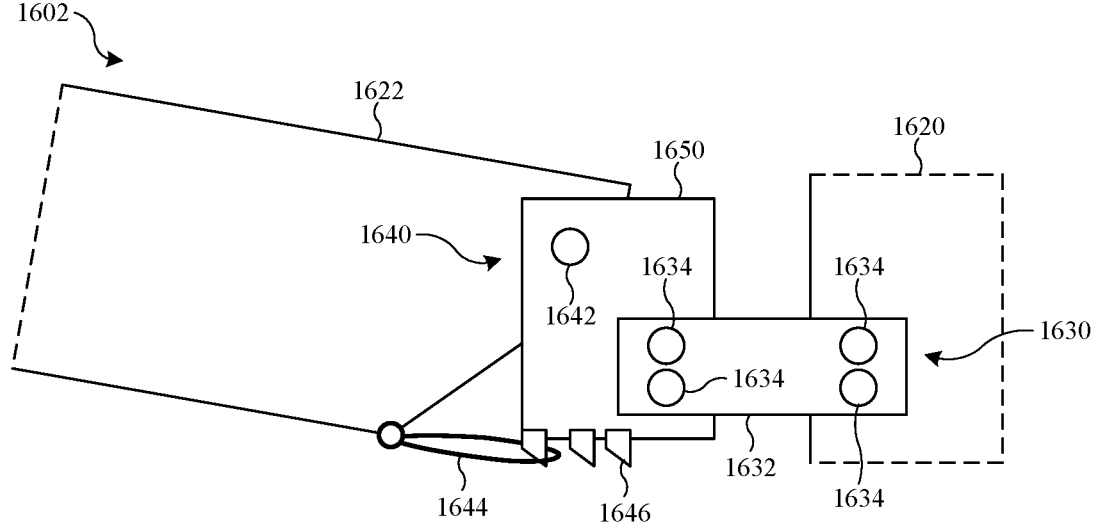
FIG. 18 is a side view illustration showing the part of the frame assembly of FIG. 16 in a second elevational position.
Figure 19:
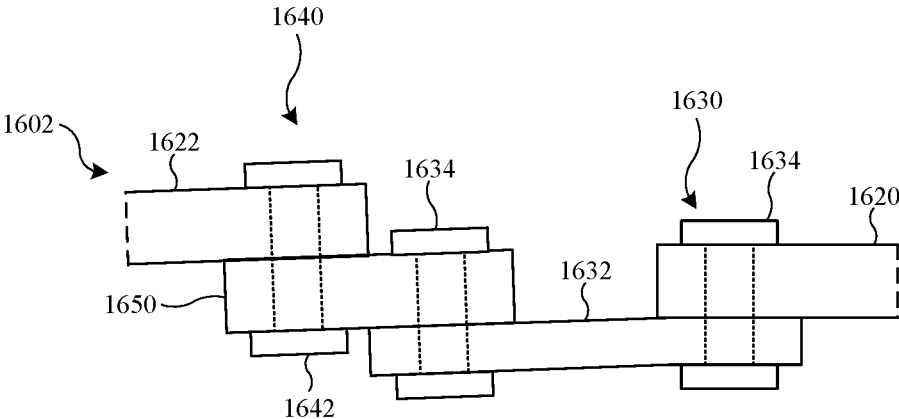
FIG. 19 is a top view illustration showing the part of the frame assembly of FIG. 16 in a second lateral position.

FIG. 16 is a side view illustration showing part of a frame assembly 1602 according to a fourth example implementation in a first elevational position, FIG. 17 is a top view illustration showing the part of the frame assembly 1602 in a first lateral position, FIG. 18 is a side view illustration showing the part of the frame assembly 1602 in a second elevational position, and FIG. 19 is a top view illustration showing the part of the frame assembly 1602 in a second lateral position. The portions of the frame assembly 1602 that are shown in FIGS. 16-19 may be incorporated in the electronic device 100 instead of corresponding portions of the frame assembly 102, including the first joint 224 and the second joint 226.

The frame assembly 1602 includes a frame portion 1620, an arm portion 1622, an intermediate portion 1650, a lateral joint 1630, and an elevational joint 1640. The description of the frame assembly 102 and its components is applicable to the frame assembly 1602 and its components except as otherwise described herein.

The intermediate portion 1650 of the frame assembly 1602 serves to separate the motion of the lateral joint 1630 and the elevational joint 1640. Thus, the joints are not directly connected to another, but instead are connected indirectly through an intermediate structure, which is the intermediate portion 1650 in this implementation. The intermediate portion 1650 may be a substantially rigid structure that is formed from any suitable material. The intermediate portion 1650 may be connected to the lateral joint 1630 and the elevational joint 1640 (e.g., located between them) but not directly connected to other portions of the frame assembly 1602 except through these connections.

The lateral joint 1630 is connected to the frame portion 1620 and to the intermediate portion 1650. The lateral joint 1630 is a structure that allows for lateral motion and adjustment of the arm portion 1622 with respect to the frame portion 1620 in a lateral direction and/or angle around a generally up-down axis. The lateral joint 1630 is biased toward the first lateral position (FIG. 17), which is a neutral position of the lateral joint 1630 that the lateral joint 1630 returns to in the absence of an external force applied to the lateral joint 1630, the intermediate portion 1650, and/or the arm portion 1622 of the frame assembly 1602. The lateral joint 1630 is movable away from the first lateral position in a first lateral direction and a second lateral direction (e.g., toward and away from the user's head). As an example, the lateral joint 1630 can be moved away from the first lateral position to the second lateral position (FIG. 19) by application of an external force that causes deflection of the lateral joint 1630.

In the illustrated example, the lateral joint 1630 includes a flexible element 1632, a fixed connection to the frame portion 1620, and a fixed connection to the intermediate portion 1650, each of which is defined by pins 1634. The flexible element 1632 is a structure that is flexible in the lateral direction so that it is able to bend laterally and return to its neutral position (e.g., corresponding to the first lateral position) when an external force is removed. The flexible element 1632 may be inflexible in other directions, such as the elevational direction. As one example, the flexible element 1632 may be a thin, substantially planar, sheet metal (e.g., steel) structure oriented so that the lateral direction is substantially normal to the planar surfaces of the sheet metal structure.

The pins 1634 (two pins for each fixed connection in the illustrated implementation) extend through holes formed in the flexible element 1632 and the frame portion 1620 or the intermediate portion 1650 and are fixed in place in the holes by fasteners, crimping, or other structures or techniques. The pins 1634 connect the flexible element 1632 to the frame portion 1620 and the intermediate portion 1650 so that the flexible element 1632 is restrained from rotating with respect to the frame portion 1620 and the intermediate portion 1650 to define the fixed connections of the lateral joint 1630 to the frame portion 1620 and the intermediate portion 1650. In the illustrated implementation, two of the pins 1634 are used at each fixed connection to resist rotation. Alternatively, a single pin at each fixed connection could be provided with anti-rotation features (e.g., a square profile) to resist rotation.

The elevational joint 1640 is connected to the intermediate portion 1650 and to the arm portion 1622 of the frame assembly 1602. The elevational joint 1640 is a rotating joint. The elevational joint 1640 connects the arm portion 1622 to the intermediate portion 1650 of the frame assembly 1602 and indirectly to the lateral joint 1630 and the frame portion 1620 of the frame assembly 1602 so that the arm portion 1622 of the frame assembly 1602 is able to rotate with respect to the frame portion 1620 of the frame assembly 1602.

The elevational joint 1640 pivot freely, but a maximum degree of rotation is established by an adjustable structure, as will be described. The elevational joint 1640 may be moved from a first elevational position (FIG. 16) until reaching an angular limit set by the adjustable structure, for example, at a second elevational position (FIG. 18).

The elevational joint 1640 includes a pin 1642 that allows relative rotation of the arm portion 1622 and the intermediate portion 1650. In the illustrated example, the pin 1642 extends through (e.g., into or completely through) holes that are formed in the intermediate portion 1650 and the arm portion 1622 of the frame assembly 1602. The pin 1642 may be, for example, secured against rotation with respect to the intermediate portion 1650, for example, by geometric features, welding, brazing, adhesives, and/or other structures and/or techniques. The pin 1642 is rotatable with respect to the arm portion 1622.

The adjustable structure that sets the maximum angle of rotation for the arm portion 1622 with respect to the intermediate portion 1650 includes a strap 1644 and teeth 1646 in illustrated implementation. The strap 1644 is a flexible member (e.g., textile, plastic, rubber) but may be inelastic or of relatively low elasticity (e.g., relatively high resistance to stretching) so that it can be tensioned to restrain rotation of the arm portion 1622 with respect to the intermediate portion 1650. The strap 1644 is connected to one of the teeth 1646 to limit rotation. The teeth 1646 are formed on the intermediate portion 1650. The teeth 1646 include multiple individual teeth that are formed on the intermediate portion 1650 at different locations (e.g., spaced in a longitudinal/front-to-back direction) so that connection of the strap 1644 to each individual tooth from the teeth 1646 corresponds to a different maximum angle of rotation of the arm portion 1622 with respect to the intermediate portion 1650. Thus, the strap 1644 is a fixed-length structure that adjusts maximum rotation according to the position at which it is connected to the intermediate portion 1650. Thus, the strap 1644 is also an example of a flexible connector structure that is connectable between the intermediate portion 1650 and the lateral joint 1630 to limit rotation of the arm portion 1622 with respect to the intermediate portion, the lateral joint 1630, and/or the frame portion 1620.

Figure 20:
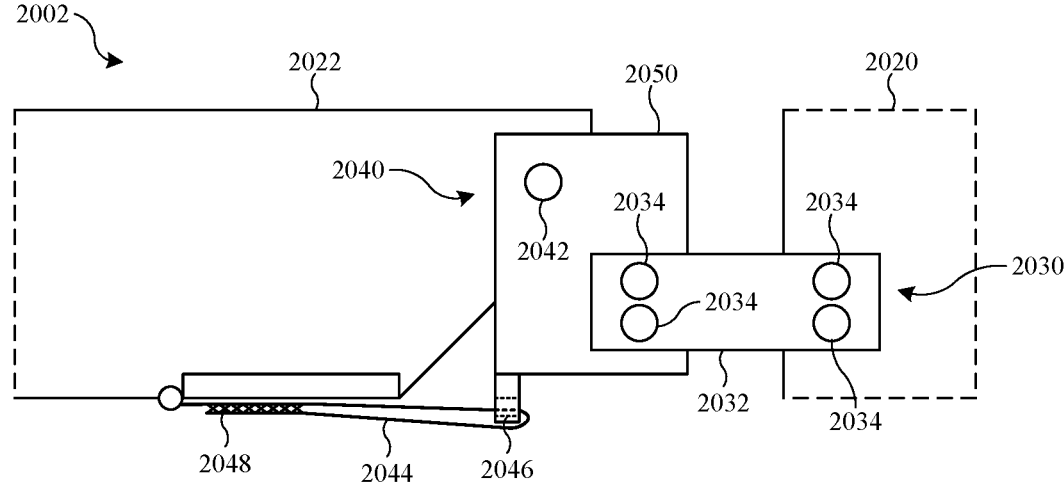
FIG. 20 is a side view illustration showing part of a frame assembly according to a fifth example implementation in a first elevational position.
Figure 21:
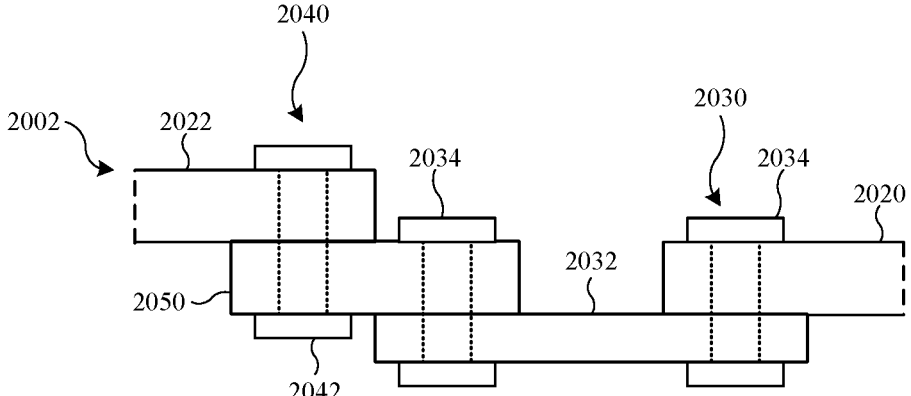
FIG. 21 is a top view illustration showing the part of the frame assembly of FIG. 20 in a first lateral position.
Figure 22:
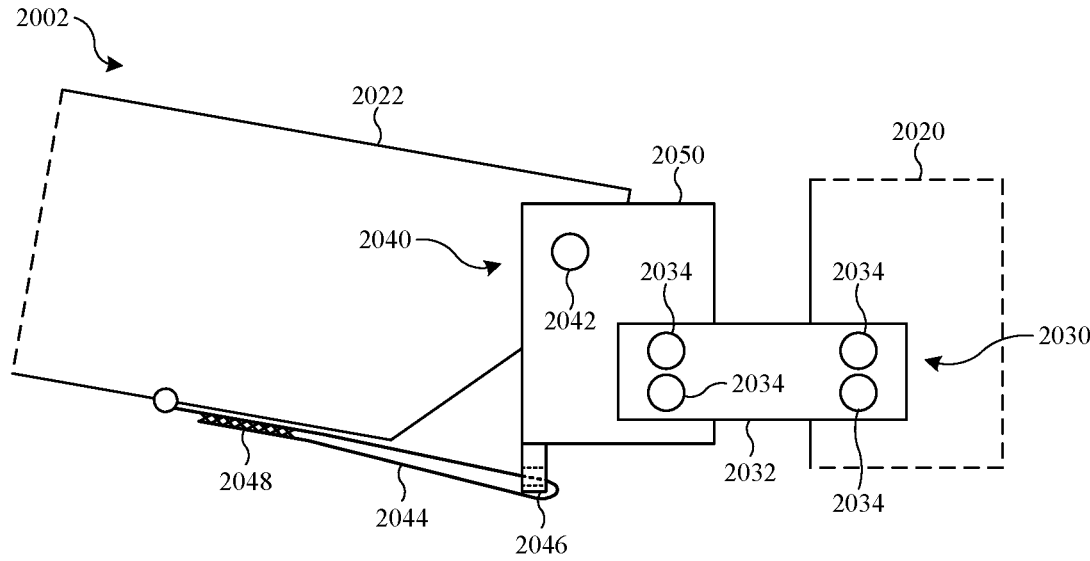
FIG. 22 is a side view illustration showing the part of the frame assembly of FIG. 20 in a second elevational position.
Figure 23:
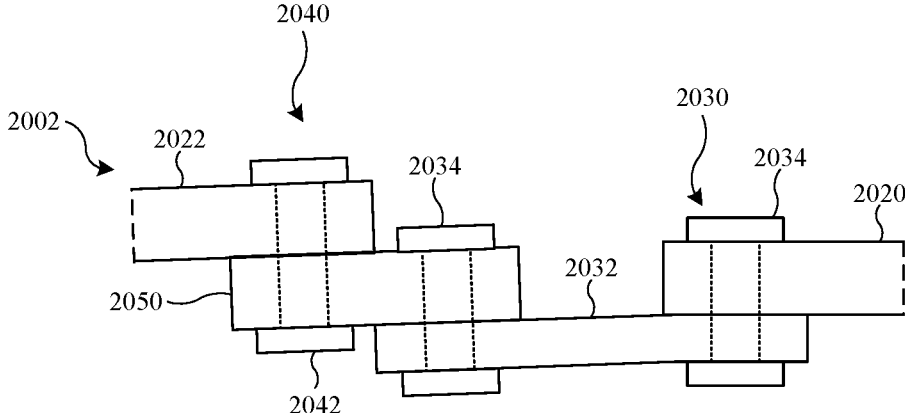
FIG. 23 is a top view illustration showing the part of the frame assembly of FIG. 20 in a second lateral position.

FIG. 20 is a side view illustration showing part of a frame assembly 2002 according to a fifth example implementation in a first elevational position, FIG. 21 is a top view illustration showing the part of the frame assembly 2002 in a first lateral position, FIG. 22 is a side view illustration showing the part of the frame assembly 2002 in a second elevational position, and FIG. 23 is a top view illustration showing the part of the frame assembly 2002 in a second lateral position. The portions of the frame assembly 2002 that are shown in FIGS. 20-23 may be incorporated in the electronic device 100 instead of corresponding portions of the frame assembly 102, including the first joint 224 and the second joint 226.

The frame assembly 2002 includes a frame portion 2020, an arm portion 2022, an intermediate portion 2050, a lateral joint 2030, and an elevational joint 2040. The description of the frame assembly 102 and its components is applicable to the frame assembly 2002 and its components except as otherwise described herein.

The intermediate portion 2050 of the frame assembly 2002 serves to separate the motion of the lateral joint 2030 and the elevational joint 2040. Thus, the joints are not directly connected to another, but instead are connected indirectly through an intermediate structure, which is the intermediate portion 2050 in this implementation. The intermediate portion 2050 may be a substantially rigid structure that is formed from any suitable material. The intermediate portion 2050 may be connected to the lateral joint 2030 and the elevational joint 2040 (e.g., located between them) but not directly connected to other portions of the frame assembly 2002 except through these connections.

The lateral joint 2030 is connected to the frame portion 2020 and to the intermediate portion 2050. The lateral joint 2030 is a structure that allows for lateral motion and adjustment of the arm portion 2022 with respect to the frame portion 2020 in a lateral direction and/or angle around a generally up-down axis. The lateral joint 2030 is biased toward the first lateral position (FIG. 21), which is a neutral position of the lateral joint 2030 that the lateral joint 2030 returns to in the absence of an external force applied to the lateral joint 2030, the intermediate portion 2050, and/or the arm portion 2022 of the frame assembly 2002. The lateral joint 2030 is movable away from the first lateral position in a first lateral direction and a second lateral direction (e.g., toward and away from the user's head). As an example, the lateral joint 2030 can be moved away from the first lateral position to the second lateral position (FIG. 23) by application of an external force that causes deflection of the lateral joint 2030.

In the illustrated example, the lateral joint 2030 includes a flexible element 2032, a fixed connection to the frame portion 2020, and a fixed connection to the intermediate portion 2050, each of which is defined by pins 2034. The flexible element 2032 is a structure that is flexible in the lateral direction so that it is able to bend laterally and return to its neutral position (e.g., corresponding to the first lateral position) when an external force is removed. The flexible element 2032 may be inflexible in other directions, such as the elevational direction. As one example, the flexible element 2032 may be a thin, substantially planar, sheet metal (e.g., steel) structure oriented so that the lateral direction is substantially normal to the planar surfaces of the sheet metal structure.

The pins 2034 (two pins for each fixed connection in the illustrated implementation) extend through holes formed in the flexible element 2032 and the frame portion 2020 or the intermediate portion 2050 and are fixed in place in the holes by fasteners, crimping, or other structures or techniques. The pins 2034 connect the flexible element 2032 to the frame portion 2020 and the intermediate portion 2050 so that the flexible element 2032 is restrained from rotating with respect to the frame portion 2020 and the intermediate portion 2050 to define the fixed connections of the lateral joint 2030 to the frame portion 2020 and the intermediate portion 2050. In the illustrated implementation, two of the pins 2034 are used at each fixed connection to resist rotation. Alternatively, a single pin at each fixed connection could be provided with anti-rotation features (e.g., a square profile) to resist rotation.

The elevational joint 2040 is connected to the intermediate portion 2050 and to the arm portion 2022 of the frame assembly 2002. The elevational joint 2040 is a rotating joint. The elevational joint 2040 connects the arm portion 2022 to the intermediate portion 2050 of the frame assembly 2002 and indirectly to the lateral joint 2030 and the frame portion 2020 of the frame assembly 2002 so that the arm portion 2022 of the frame assembly 2002 is able to rotate with respect to the frame portion 2020 of the frame assembly 2002.

The elevational joint 2040 pivot freely, but a maximum degree of rotation is established by an adjustable structure, as will be described. The elevational joint 2040 may be moved from a first elevational position (FIG. 20) until reaching an angular limit set by the adjustable structure, for example, at a second elevational position (FIG. 22).

The elevational joint 2040 includes a pin 2042 that allows rotation of the arm portion 2022 relative to the intermediate portion 2050. In the illustrated example, the pin 2042 extends through (e.g., into or completely through) holes that are formed in the intermediate portion 2050 and the arm portion 2022 of the frame assembly 2002. The pin 2042 may be, for example, secured against rotation with respect to the intermediate portion 2050, for example, by geometric features, welding, brazing, adhesives, and/or other structures and/or techniques. The pin 2042 is rotatable with respect to the arm portion 2022.

The adjustable structure that sets the maximum angle of rotation for the arm portion 2022 with respect to the intermediate portion 2050 includes a strap 2044 and a connector slot 2046 in illustrated implementation. The strap 2044 is a flexible member (e.g., textile, plastic, rubber) but may be inelastic or of relatively low elasticity (e.g., relatively high resistance to stretching) so that it can be tensioned to restrain rotation of the arm portion 2022 with respect to the intermediate portion 2050. The strap 2044 includes a fastener structure 2048 (e.g., two complementary areas of hook and loop fastener portions). The strap 2044 is connected to the arm portion 2022 and extends through the connector slot 2046, which is formed on the intermediate portion, and then doubled back for connecting using the fastener structure 2048, so that the connector slot engages an intermediate location along the strap 2044 in order to limit the maximum rotation angle of the arm portion 2022 with respect to the intermediate portion 2050. Thus, the strap 2044 defines an adjustable-length structure, that adjusts maximum rotation according to the adjusted length of the strap 2044. Thus, the strap 2044 is also an example of a flexible connector structure that is connectable between the intermediate portion 2050 and the lateral joint 2030 to limit rotation of the arm portion 2022 with respect to the intermediate portion, the lateral joint 2030, and/or the frame portion 2020. The strap 2044 is also an example of a flexible connector structure that is connectable to limit rotation of the elevational joint 2040.

Figure 24:
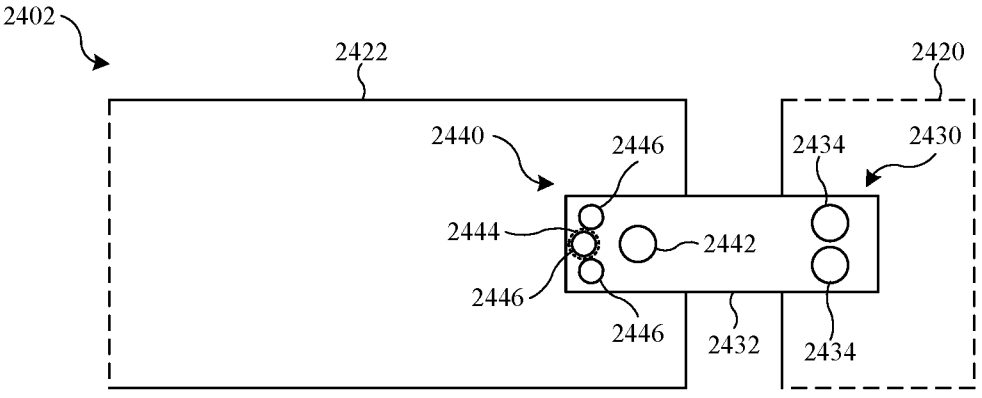
FIG. 24 is a side view illustration showing part of a frame assembly according to a sixth example implementation in a first elevational position.
Figure 25:
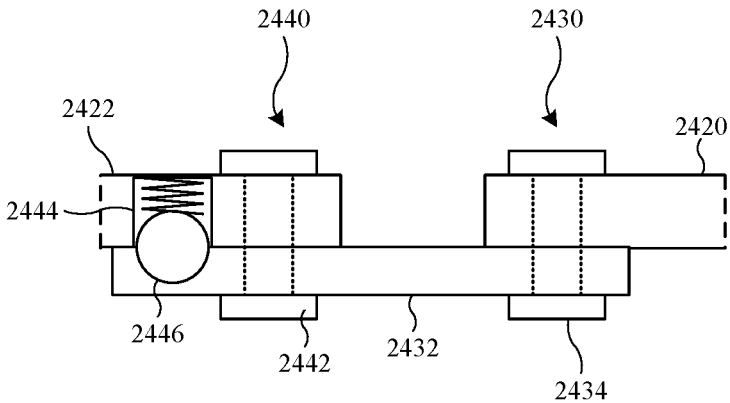
FIG. 25 is a top view illustration showing the part of the frame assembly of FIG. 24 in a first lateral position.
Figure 26:
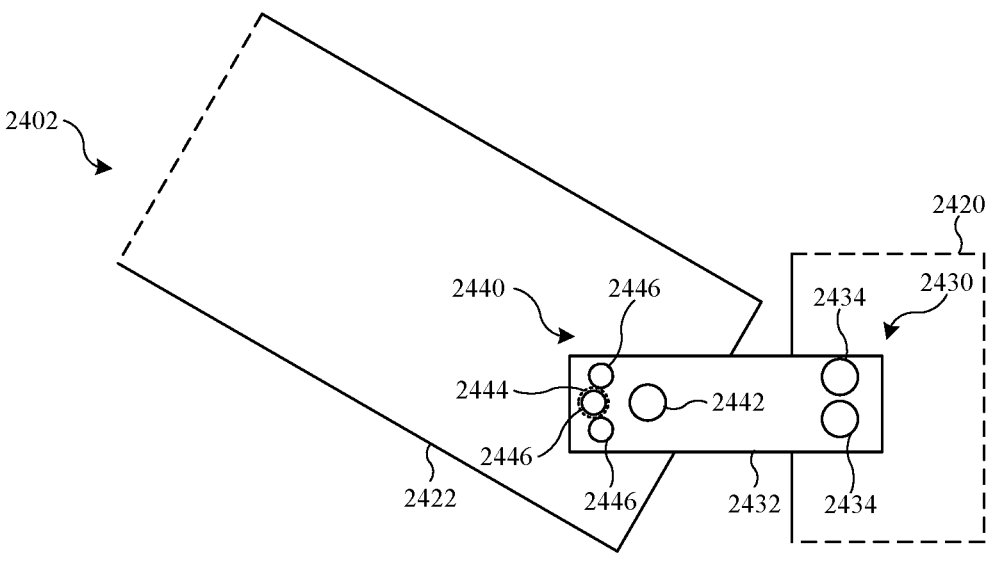
FIG. 26 is a side view illustration showing the part of the frame assembly of FIG. 24 in a second elevational position.
Figure 27:
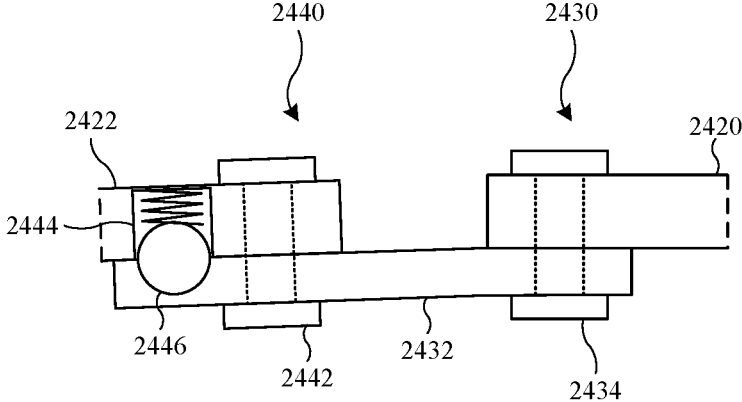
FIG. 27 is a top view illustration showing the part of the frame assembly of FIG. 24 in a second lateral position.

FIG. 24 is a side view illustration showing part of a frame assembly 2402 according to a sixth example implementation in a first elevational position, FIG. 25 is a top view illustration showing the part of the frame assembly 2402 in a first lateral position, FIG. 26 is a side view illustration showing the part of the frame assembly 2402 in a second elevational position, and FIG. 27 is a top view illustration showing the part of the frame assembly 2402 in a second lateral position. The portions of the frame assembly 2402 that are shown in FIGS. 24-27 may be incorporated in the electronic device 100 instead of corresponding portions of the frame assembly 102, including the first joint 224 and the second joint 226.

The frame assembly 2402 includes a frame portion 2420, an arm portion 2422, a lateral joint 2430, and an elevational joint 2440. The description of the frame assembly 102 and its components is applicable to the frame assembly 2402 and its components except as otherwise described herein.

The lateral joint 2430 is connected to the frame portion 2420 and to the elevational joint 2440. The lateral joint 2430 is a structure that allows for lateral motion and adjustment of the arm portion 2422 with respect to the frame portion 2420 in a lateral direction and/or angle around a generally up-down axis. The lateral joint 2430 is biased toward the first lateral position (FIG. 25), which is a neutral position of the lateral joint 2430 that the lateral joint 2430 returns to in the absence of an external force applied to the lateral joint 2430 and/or the arm portion 2422 of the frame assembly 2402. The lateral joint 2430 is movable away from the first lateral position in a first lateral direction and a second lateral direction (e.g., toward and away from the user's head). As an example, the lateral joint 2430 can be moved away from the first lateral position to the second lateral position (FIG. 27) by application of an external force that causes deflection of the lateral joint 2430.

In the illustrated example, the lateral joint 2430 includes a flexible element 2432, a fixed connection to the frame portion 2420, and a direct connection to the elevational joint 2440, which connects the lateral joint 2430 to the arm portion 2422. The fixed connection of the lateral joint 2430 to the frame portion 2420 is defined by pins 2434. The flexible element 2432 is a structure that is flexible in the lateral direction so that it is able to bend laterally and return to its neutral position (e.g., corresponding to the first lateral position) when an external force is removed. The flexible element 2432 may be inflexible in other directions, such as the elevational direction. As one example, the flexible element 2432 may be a thin, substantially planar, sheet metal (e.g., steel) structure oriented so that the lateral direction is substantially normal to the planar surfaces of the sheet metal structure.

The pins 2434 (two pins in the illustrated implementation) extend through holes formed in the flexible element 2432 and the frame portion 2420 and are fixed in place in the holes by fasteners, crimping, or other structures or techniques. The pins 2434 connect the flexible element 2432 to the frame portion 2420 so that the flexible element 2432 is restrained from rotating with respect to the frame portion 2420 to define the fixed connection of the lateral joint 2430 to the frame portion 2420. In the illustrated implementation, two of the pins 2434 are used at the fixed connection to resist rotation. Alternatively, a single pin at the fixed connection could be provided with anti-rotation features (e.g., a square profile) to resist rotation.

The elevational joint 2440 is connected to the flexible element 2432 of the lateral joint 2430 and to the arm portion 2422 of the frame assembly 2402. The elevational joint 2440 is a rotating joint. The elevational joint 2440 connects the arm portion 2422 to the lateral joint 2430 and the frame portion 2420 of the frame assembly 2402 so that the arm portion 2422 of the frame assembly 2402 is able to rotate with respect to the frame portion 2420 of the frame assembly 2402.

The elevational joint 2440 includes a detent structure that is configured to allow the elevational joint to pivot between detent positions, and to hold the elevational joint at predetermined angular orientations as a result of engagement of detent features that restrain rotation of the arm portion 2422 with respect to the lateral joint 2430. In the illustrated implementation, the detent features are released in response to an applied rotational force that overcomes the spring force that holds the detent features in place. Thus, the elevational joint 2440 may be moved from a first elevational position (FIG. 24) until a magnitude of a force applied to it (e.g., by the user) is greater than the internal friction so that the external force overcomes the internal friction and moves the elevational joint 2440 away from the first elevational position, for example, to a second elevational position (FIG. 26).

The elevational joint 2440 includes a pin 2442 that allows rotation of the arm portion 2422 relative to the lateral joint 2430. In the illustrated example, the pin 2442 extends through (e.g., into or completely through) holes that are formed in the flexible element 2432 of the lateral joint 2430 and the arm portion 2422 of the frame assembly 2402. The pin 2442 may be, for example, secured against rotation with respect to the flexible element 2432 of the lateral joint 2430, for example, by geometric features, welding, brazing, adhesives, and/or other structures and/or techniques. The pin 2442 is rotatable with respect to the arm portion 2422. The pin 2442 may be freely rotatable with respect to the arm portion 2422 absent engagement of detent features.

The detent features of the elevational joint 2440 include, in the illustrated example, an engaging structure 2444 and receiving structures 2446. In the illustrated example, the engaging structure 2444 is formed on the arm portion 2422 of the frame assembly 2402 and the receiving structures 2446 are formed on the flexible element 2432 of the lateral joint 2430. This arrangement can, however, be reversed.

The engaging structure 2444 may be a biased element that is engageable with each of the receiving structures 2446, and disengages from the receiving structures 2446 when an applied force overcomes a biasing force of the engaging structure 2444. In the illustrated example, the engaging structure includes a detent ball and a spring that biases the detent ball toward the receiving structures. The receiving structures 2446 are geometric features that are complementary to the engaging structure 2444, such as recesses that have a shape that can be engaged by the engaging structures. Each of the receiving structures 2446 corresponds to a different angular orientation of the arm portion 2422 with respect to the frame portion 2420 of the frame assembly 2402. Thus, the detent features may establish a first angular orientation of the arm portion 2422 with respect to the frame portion 2420 by engagement of the engaging structure 2444 with a first receiving structure of the receiving structures 2446 in a first detent position and the detent features may establish a second angular orientation of the arm portion 2422 with respect to the frame portion 2420 by engagement of the engaging structure 2444 with a second receiving structure of the receiving structures 2446 in a second detent position. Additional detent positions may be established according to the number of the receiving structures, such as three in the illustrated implementation.

Figure 28:
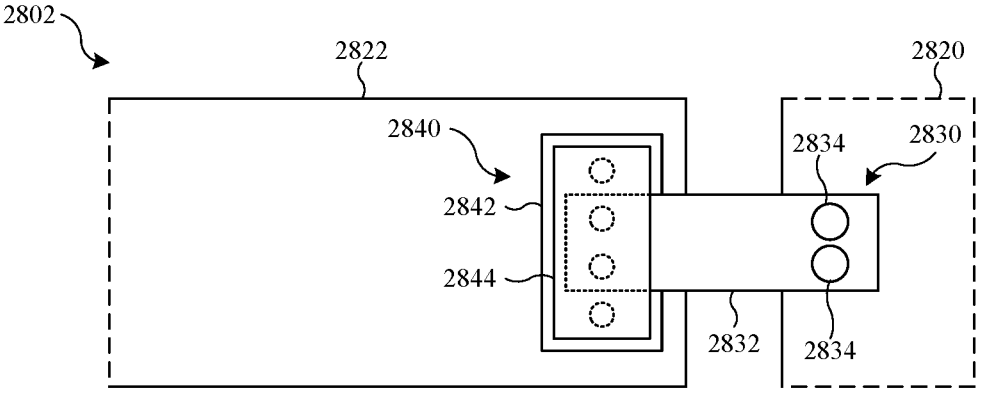
FIG. 28 is a side view illustration showing part of a frame assembly according to a seventh example implementation in a first elevational position.
Figure 29:
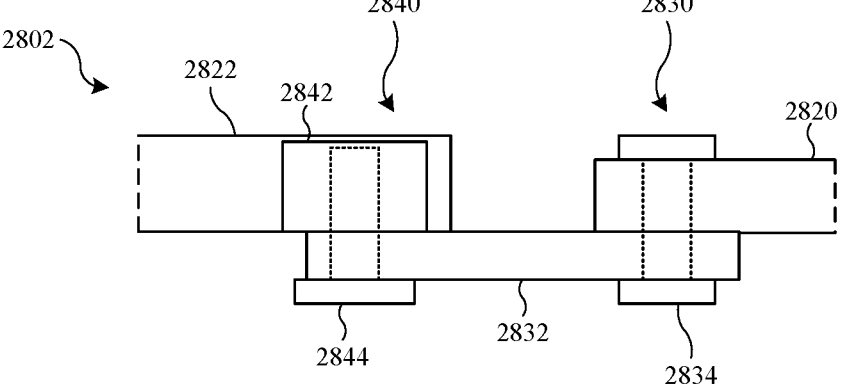
FIG. 29 is a top view illustration showing the part of the frame assembly of FIG. 28 in a first lateral position.
Figure 30:
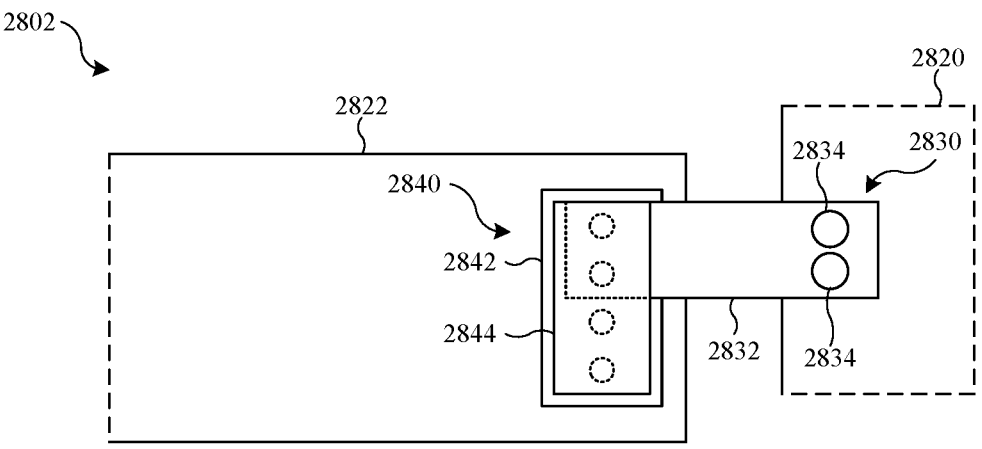
FIG. 30 is a side view illustration showing the part of the frame assembly of FIG. 28 in a second elevational position.
Figure 31:
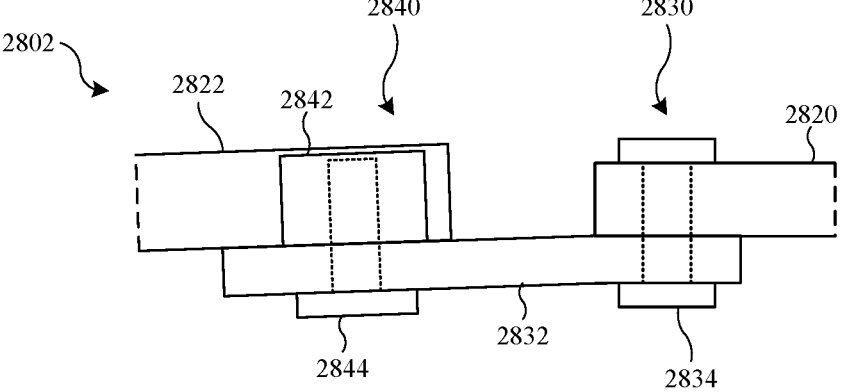
FIG. 31 is a top view illustration showing the part of the frame assembly of FIG. 28 in a second lateral position.

FIG. 28 is a side view illustration showing part of a frame assembly 2802 according to a sixth example implementation in a first elevational position, FIG. 29 is a top view illustration showing the part of the frame assembly 2802 in a first lateral position, FIG. 30 is a side view illustration showing the part of the frame assembly 2802 in a second elevational position, and FIG. 31 is a top view illustration showing the part of the frame assembly 2802 in a second lateral position. The portions of the frame assembly 2802 that are shown in FIGS. 28-31 may be incorporated in the electronic device 100 instead of corresponding portions of the frame assembly 102, including the first joint 224 and the second joint 226.

The frame assembly 2802 includes a frame portion 2820, an arm portion 2822, a lateral joint 2830, and an elevational joint 2840. The description of the frame assembly 102 and its components is applicable to the frame assembly 2802 and its components except as otherwise described herein.

The lateral joint 2830 is connected to the frame portion 2820 and to the elevational joint 2840. The lateral joint 2830 is a structure that allows for lateral motion and adjustment of the arm portion 2822 with respect to the frame portion 2820 in a lateral direction and/or angle around a generally up-down axis. The lateral joint 2830 is biased toward the first lateral position (FIG. 29), which is a neutral position of the lateral joint 2830 that the lateral joint 2830 returns to in the absence of an external force applied to the lateral joint 2830 and/or the arm portion 2822 of the frame assembly 2802. The lateral joint 2830 is movable away from the first lateral position in a first lateral direction and a second lateral direction (e.g., toward and away from the user's head). As an example, the lateral joint 2830 can be moved away from the first lateral position to the second lateral position (FIG. 31) by application of an external force that causes deflection of the lateral joint 2830.

In the illustrated example, the lateral joint 2830 includes a flexible element 2832, a fixed connection to the frame portion 2820, and a direct connection to the elevational joint 2840, which connects the lateral joint 2830 to the arm portion 2822. The fixed connection of the lateral joint 2830 to the frame portion 2820 is defined by pins 2834. The flexible element 2832 is a structure that is flexible in the lateral direction so that it is able to bend laterally and return to its neutral position (e.g., corresponding to the first lateral position) when an external force is removed. The flexible element 2832 may be inflexible in other directions, such as the elevational direction. As one example, the flexible element 2832 may be a thin, substantially planar, sheet metal (e.g., steel) structure oriented so that the lateral direction is substantially normal to the planar surfaces of the sheet metal structure.

The pins 2834 (two pins in the illustrated implementation) extend through holes formed in the flexible element 2832 and the frame portion 2820 and are fixed in place in the holes by fasteners, crimping, or other structures or techniques. The pins 2834 connect the flexible element 2832 to the frame portion 2820 so that the flexible element 2832 is restrained from rotating with respect to the frame portion 2820 to define the fixed connection of the lateral joint 2830 to the frame portion 2820. In the illustrated implementation, two of the pins 2834 are used at the fixed connection to resist rotation. Alternatively, a single pin at the fixed connection could be provided with anti-rotation features (e.g., a square profile) to resist rotation.

The elevational joint 2840 is connected to the flexible element 2832 of the lateral joint 2830 and to the arm portion 2822 of the frame assembly 2802. The elevational joint 2840 is an adjustable connection that allows the flexible element of the lateral joint 2830 to be connected to the arm portion 2822 at one of several discrete positions that, in the illustrated example, are spaced in an up/down direction so that the elevational position of the arm portion 2822 may be adjusted relative to the frame portion 2820 without rotation of the arm portion 2822 with respect to the frame portion 2820. The elevational joint 2840 connects the arm portion 2822 to the lateral joint 2830 and the frame portion 2820 of the frame assembly 2802 so that the arm portion 2822 of the frame assembly 2802 is able to be moved up and down (e.g., between two or more translational positions in an elevational direction) with respect to the frame portion 2820 of the frame assembly 2802. For example, the arm portion 2822 can be moved between a first elevational position (FIG. 28) and a second elevational position (FIG. 30).

Figure 32:
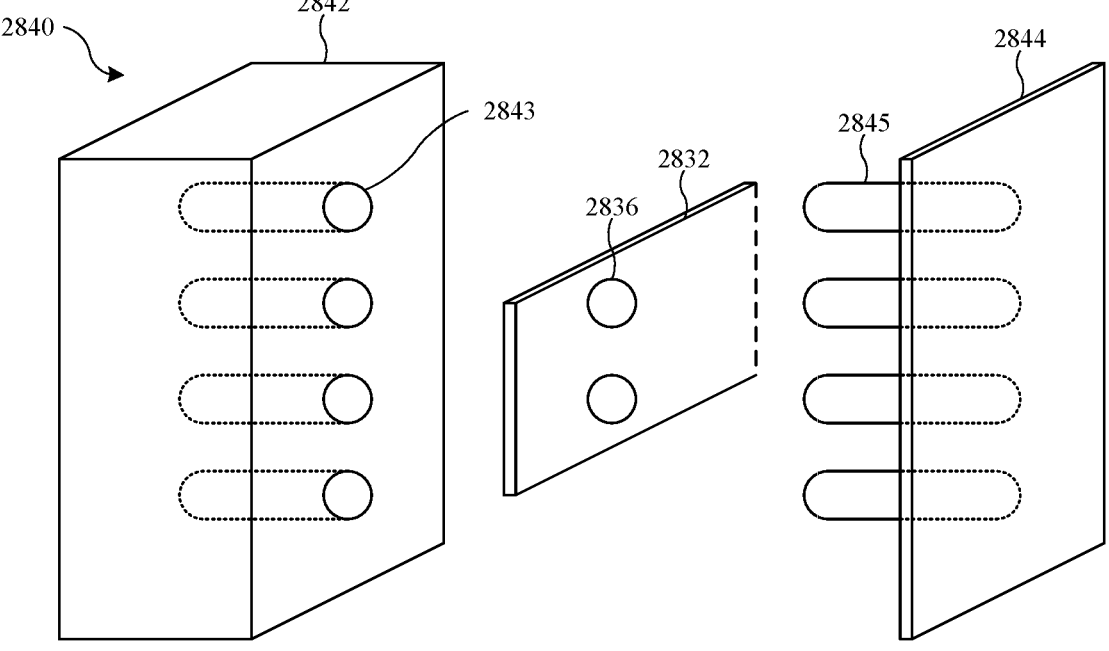
FIG. 32 is a perspective detail view that shows a first magnetic connector portion and a second magnetic connector portion of the frame assembly of FIG. 28

In the illustrated example, the elevational joint 2840 includes a magnetic connector assembly that allows the elevational joint to be moved between elevational positions (e.g., a first elevational position and a second elevational position). The elevational joint 2840 includes a first magnetic connector portion 2842 and a second magnetic connector portion 2844. FIG. 32 is a perspective detail view that shows the first magnetic connector portion 2842 and the second magnetic connector portion 2844. The first magnetic connector portion 2842 and the second magnetic connector portion 2844 are configured to exert a magnetic attraction force. As one example, one of the first magnetic connector portion 2842 and the second magnetic connector portion 2844 may include a permanent magnet material and the other may be made from a material that is attracted to magnets (e.g., ferromagnetic metals). As another example, the first magnetic connector portion 2842 and the second magnetic connector portion 2844 may both include magnetic materials with their magnetic poles oriented so that they are attracted to each other.

In the illustrated example, the first magnetic connector portion 2842 is permanently connected to or formed integrally with the arm portion 2822 and the second magnetic connector portion 2844 is a separate element that can be connected to and disconnected from the first magnetic connector portion 2842. Thus, the first magnetic connector portion 2842 and the second magnetic connector portion 2844 are movable between a connected position, where they are connected to each other, and a disconnected position, where they are separated from each other.

The first magnetic connector portion 2842 and the second magnetic connector portion 2844 incorporate structures that are connectable to the flexible element 2832 of the lateral joint 2830 and that allow elevational adjustment. In the illustrated example, two holes 2836 are formed through the flexible element 2832. The first magnetic connector portion 2842 and the second magnetic connector portion 2844 may incorporate, for example, complementary sets of pins and holes that are configured to engage, retain, and restrain rotation of the flexible element 2832 in the connected position. In the illustrated example, the first magnetic connector portion 2842 includes holes 2843 (four holes in the illustrated implementation) and the second magnetic connector portion 2844 includes pins 2845 (four pins in the illustrated example. The flexible element 2832 is connected by inserting a selected pair of the pins 2845 (corresponding to a selected elevational position) through the holes 2836 and then connecting the second magnetic connector portion 2844 to the first magnetic connector portion 2842. The elevational position can be changed by returning the assembly to the disconnected position and moving the flexible element 2832 relative to the pins 2845.

Figure 33:
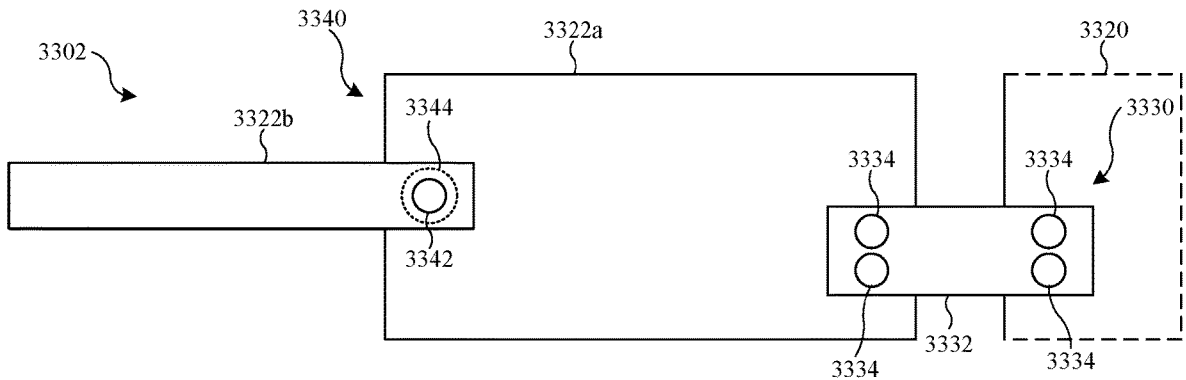
FIG. 33 is a side view illustration showing part of a frame assembly according to an eighth example implementation in a first elevational position.
Figure 34:
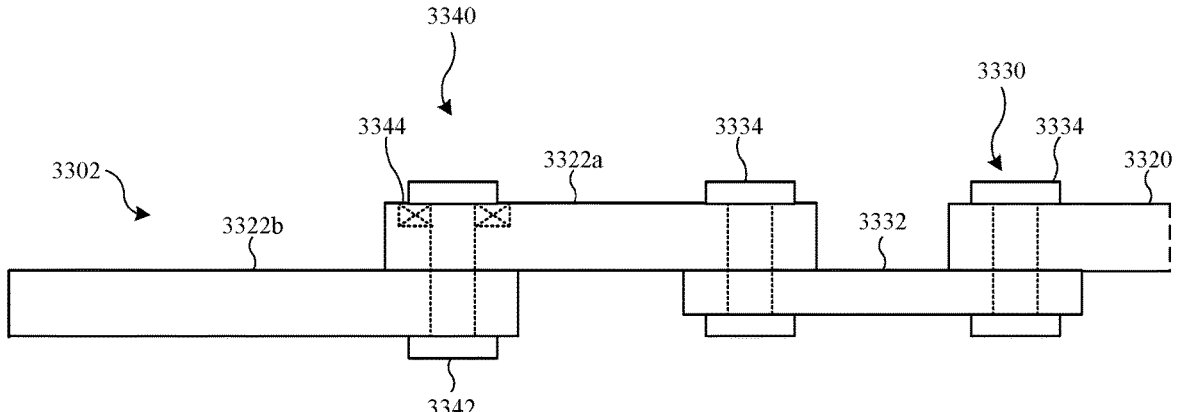
FIG. 34 is a top view illustration showing the part of the frame assembly of FIG. 33 in a first lateral position.
Figure 35:
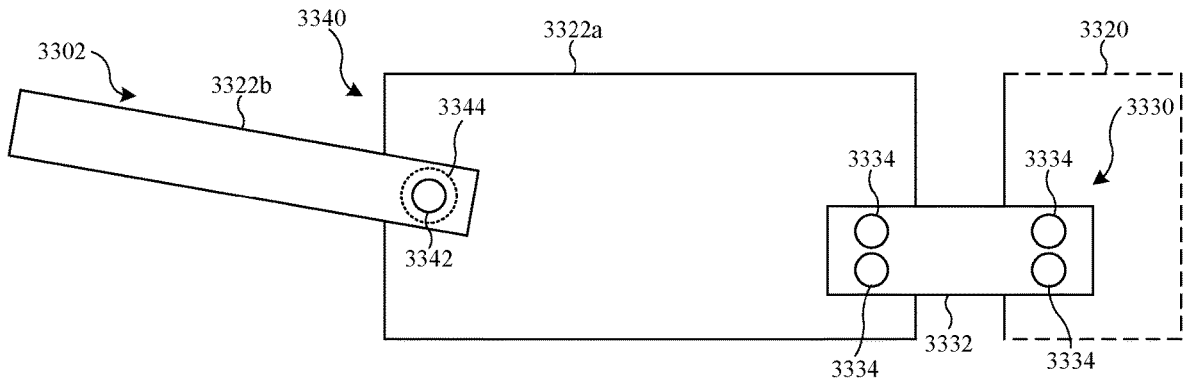
FIG. 35 is a side view illustration showing the part of the frame assembly of FIG. 33 in a second elevational position.
Figure 36:
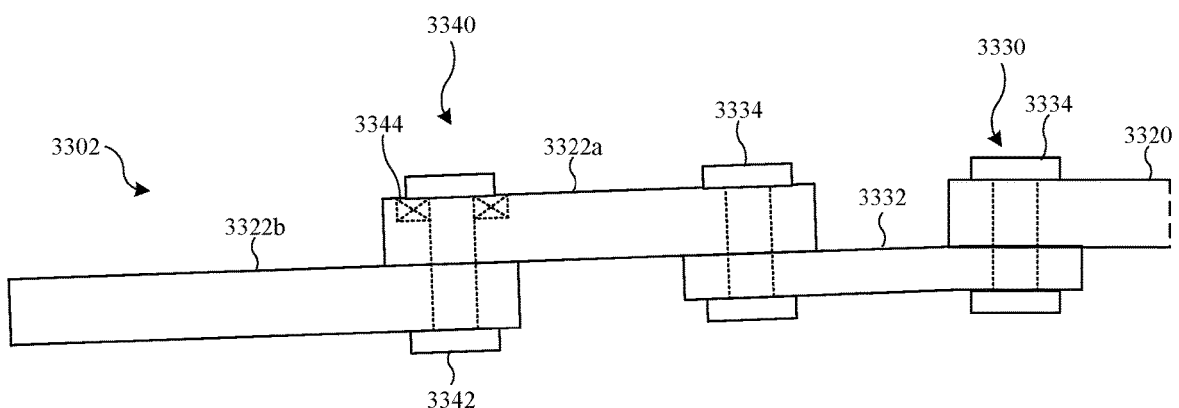
FIG. 36 is a top view illustration showing the part of the frame assembly of FIG. 33 in a second lateral position.

FIG. 33 is a side view illustration showing part of a frame assembly 3302 according to a second example implementation in a first elevational position, FIG. 34 is a top view illustration showing the part of the frame assembly 3302 in a first lateral position, FIG. 35 is a side view illustration showing the part of the frame assembly 3302 in a second elevational position, and FIG. 36 is a top view illustration showing the part of the frame assembly 3302 in a second lateral position. The portions of the frame assembly 3302 that are shown in FIGS. 33-36 may be incorporated in the electronic device 100 instead of corresponding portions of the frame assembly 102, including the first joint 224 and the second joint 226.

The frame assembly 3302 includes a frame portion 3320, an arm frame portion 3322a, an arm tip portion 3322b, a lateral joint 3330, and an elevational joint 3340. The description of the frame assembly 102 and its components is applicable to the frame assembly 3302 and its components except as otherwise described herein.

The lateral joint 3330 is connected to the frame portion 3320 and to the arm frame portion 3322a. The lateral joint 3330 is a structure that allows for lateral motion and adjustment of the arm frame portion 3322a and the arm tip portion 3322b with respect to the frame portion 3320 in a lateral direction and/or angle around a generally up-down axis. The lateral joint 3330 is biased toward the first lateral position (FIG. 34), which is a neutral position of the lateral joint 3330 that the lateral joint 3330 returns to in the absence of an external force applied to the lateral joint 3330, the arm frame portion 3322a, and/or the arm tip portion 3322b of the frame assembly 3302. The lateral joint 3330 is movable away from the first lateral position in a first lateral direction and a second lateral direction (e.g., toward and away from the user's head). As an example, the lateral joint 3330 can be moved away from the first lateral position to the second lateral position (FIG. 36) by application of an external force that causes deflection of the lateral joint 3330.

In the illustrated example, the lateral joint 3330 includes a flexible element 3332, a fixed connection to the frame portion 3320, and a fixed connection to the arm frame portion 3322a, each of which is defined by pins 3334. The flexible element 3332 is a structure that is flexible in the lateral direction so that it is able to bend laterally and return to its neutral position (e.g., corresponding to the first lateral position) when an external force is removed. The flexible element 3332 may be inflexible in other directions, such as the elevational direction. As one example, the flexible element 3332 may be a thin, substantially planar, sheet metal (e.g., steel) structure oriented so that the lateral direction is substantially normal to the planar surfaces of the sheet metal structure.

The pins 3334 (two pins for each fixed connection in the illustrated implementation) extend through holes formed in the flexible element 3332 and the frame portion 3320 or the arm frame portion 3322a and are fixed in place in the holes by fasteners, crimping, or other structures or techniques. The pins 3334 connect the flexible element 3332 to the frame portion 3320 and the arm frame portion 3322a so that the flexible element 3332 is restrained from rotating with respect to the frame portion 3320 and the arm frame portion 3322a to define the fixed connections of the lateral joint 3330 to the frame portion 3320 and the arm frame portion 3322a. In the illustrated implementation, two of the pins 3334 are used at each fixed connection to resist rotation. Alternatively, a single pin at each fixed connection could be provided with anti-rotation features (e.g., a square profile) to resist rotation.

The arm frame portion 3322a and the arm tip portion 3322b cooperate to define an arm portion that is equivalent to, for example, the arm portion 222 of the frame assembly 102. As an example, the arm frame portion 3322a and the arm tip portion 3322b may each comprise approximately half of the total length of the arm portion that they cooperate to define. The arm tip portion 3322b is intended to be engageable with the user's ear. The arm frame portion 3322a is intended to be positioned between the frame portion 3320 and the user's ear, and is not intended for engagement with the user's ear. In the illustrated example, a height dimension of the arm frame portion 3322a is greater than (e.g., by double or more) a height dimension of the arm tip portion 3322b.

The elevational joint 3340 is connected to the arm frame portion 3332a and the arm tip portion 3332b. The elevational joint 3340 is a rotating joint. The elevational joint 3340 connects the arm tip portion 3322b to the arm frame portion 3322a of the frame assembly 3302 and indirectly to the lateral joint 3330 and the frame portion 3320 of the frame assembly 3302 so that the arm tip portion 3322b of the frame assembly 3302 is able to rotate with respect to the frame portion 3320 of the frame assembly 3302.

The elevational joint 3340 does not pivot freely, but instead is maintained in a particular angular orientation as a result of internal friction. The elevational joint 3340 may be restrained from moving away from a first elevational position (FIG. 33) until a magnitude of a force applied to it (e.g., by the user) is greater than the internal friction, at which point the external force overcomes the internal friction and moves the elevational joint 3340 away from the first elevational position, for example, to a second elevational position (FIG. 35).

The elevational joint 3340 includes a pin 3342 that allows relative rotation of the arm tip portion 3322b and the arm frame portion 3322a. In the illustrated example, the pin 3342 extends through (e.g., into or completely through) holes that are formed in the arm tip portion 3322b and the arm frame portion 3322a of the frame assembly 3302. The pin 3342 may be, for example, secured against rotation with respect to the arm tip portion 3322b, for example, by geometric features, welding, brazing, adhesives, and/or other structures and/or techniques. The pin 3342 is rotatable with respect to the arm frame portion 3322a. Internal friction of the elevational joint 3340 may be present as a result of material properties of components such as the pin 3342 and the arm frame portion 3322a or may be enhanced by provision of a structure that is made from a high-friction material that acts on the pin 3342 or associated structures to restrain rotation of the pin 3342 until a sufficiently high external force is applied. In the illustrated example, a friction element 3344 (e.g., a rubber bushing) is located in or on the arm frame portion 3322a and contacts a surface (e.g., a peripheral shaft surface) of the pin 3342 to restrain rotation of the pin 3342 until a sufficiently high external force is applied.

Figure 37:
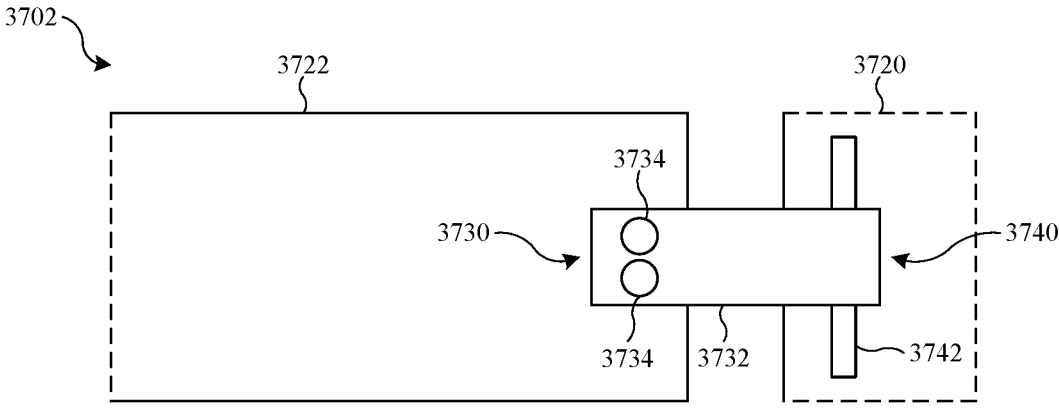
FIG. 37 is a side view illustration showing part of a frame assembly according to a ninth example implementation in a first elevational position.
Figure 38:
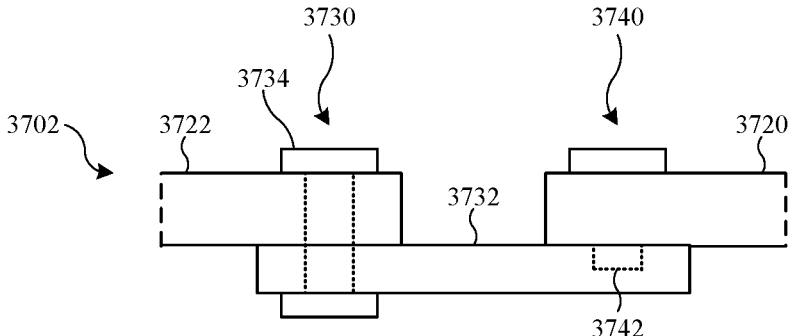
FIG. 38 is a top view illustration showing the part of the frame assembly of FIG. 37 in a first lateral position.
Figure 39:
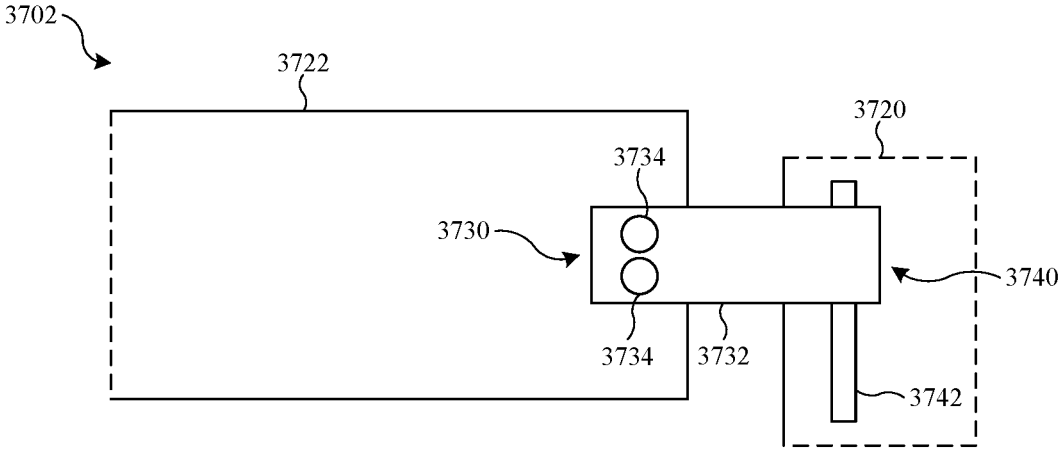
FIG. 39 is a side view illustration showing the part of the frame assembly of FIG. 37 in a second elevational position.
Figure 40:
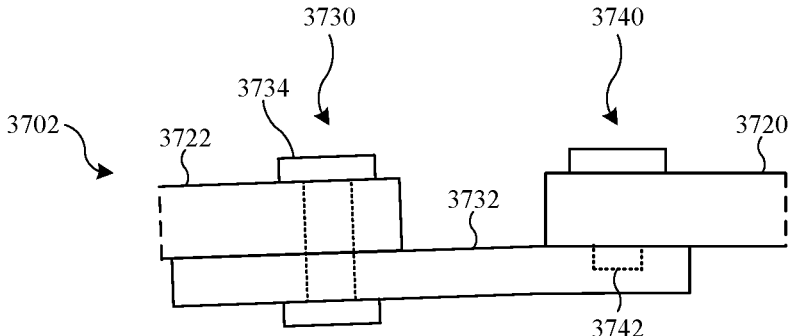
FIG. 40 is a top view illustration showing the part of the frame assembly of FIG. 37 in a second lateral position.

FIG. 37 is a side view illustration showing part of a frame assembly 3702 according to a ninth example implementation in a first elevational position, FIG. 38 is a top view illustration showing the part of the frame assembly 3702 in a first lateral position, FIG. 39 is a side view illustration showing the part of the frame assembly 3702 in a second elevational position, and FIG. 40 is a top view illustration showing the part of the frame assembly 3702 in a second lateral position. The portions of the frame assembly 3702 that are shown in FIGS. 37-40 may be incorporated in the electronic device 100 instead of corresponding portions of the frame assembly 102, including the first joint 224 and the second joint 226.

The frame assembly 3702 includes a frame portion 3720, an arm portion 3722, a lateral joint 3730, and an elevational joint 3740. The description of the frame assembly 102 and its components is applicable to the frame assembly 3702 and its components except as otherwise described herein.

The lateral joint 3730 is connected to the arm portion 3722 and to the elevational joint 3740. The lateral joint 3730 is a structure that allows for lateral motion and adjustment of the arm portion 3722 with respect to the frame portion 3720 in a lateral direction and/or angle around a generally up-down axis. The lateral joint 3730 is biased toward the first lateral position (FIG. 38), which is a neutral position of the lateral joint 3730 that the lateral joint 3730 returns to in the absence of an external force applied to the lateral joint 3730 and/or the arm portion 3722 of the frame assembly 3702. The lateral joint 3730 is movable away from the first lateral position in a first lateral direction and a second lateral direction (e.g., toward and away from the user's head). As an example, the lateral joint 3730 can be moved away from the first lateral position to the second lateral position (FIG. 40) by application of an external force that causes deflection of the lateral joint 3730.

In the illustrated example, the lateral joint 3730 includes a flexible element 3732 and a fixed connection to the arm portion 3722 that is defined by pins 3734. The flexible element 3732 is a structure that is flexible in the lateral direction so that it is able to bend laterally and return to its neutral position (e.g., corresponding to the first lateral position) when an external force is removed. The flexible element 3732 may be inflexible in other directions, such as the elevational direction. As one example, the flexible element 3732 may be a thin, substantially planar, sheet metal (e.g., steel) structure oriented so that the lateral direction is substantially normal to the planar surfaces of the sheet metal structure.

The pins 3734 (two pins in the illustrated implementation) extend through holes formed in the flexible element 3732 and the arm portion 3722 and are fixed in place in the holes by fasteners, crimping, or other structures or techniques. The pins 3734 connect the flexible element 3732 to the arm portion 3722 so that the flexible element 3732 is restrained from rotating with respect to the arm portion 3722 to define the fixed connection of the lateral joint 3730 to the arm portion 3722. In the illustrated implementation, two of the pins 3734 are used to resist rotation. Alternatively, a single pin could be provided with anti-rotation features (e.g., a square profile) to resist rotation.

The elevational joint 3740 is connected to the lateral joint 3730 and to the frame portion 3720 of the frame assembly 3702. The elevational joint 3740 is a translating joint that allows the elevational joint 3740 to slide between elevational positions (e.g., a first elevational position and a second elevational position). The elevational joint is a sliding joint that allows sliding along a substantially linear axis that is defined by structural features of the elevational joint 3740. The elevational joint 3740 connects the lateral joint 3730 to the frame portion 3720 of the frame assembly 3702 so that the lateral joint and the arm portion 3722 of the frame assembly 3702 are able to translate in an elevational direction (up/down) with respect to the frame portion 3720 of the frame assembly 3702.

The elevational joint 3740 may be restrained from moving (e.g., allowing translation) from a first elevational position (FIG. 37) until a magnitude of a force applied to it (e.g., by the user) is greater than an internal friction of the elevational joint, at which point the external force overcomes the internal friction and moves the elevational joint 3740 away from the first elevational position, for example, to a second elevational position (FIG. 39).

In the illustrated example, the elevational joint 3740 includes a track 3742 that extends in the elevational direction on the frame portion 3720 of the frame assembly 3702. The lateral joint 3730 is connected to the track 3742 (e.g., by a corresponding channel or other connector structure) either by direct connection of the flexible element 3732 or through an intermediate structure. Internal friction of the elevational joint 3740 may be present as a result of material properties of components such as the track 3742 and the lateral joint or may be enhanced by provision of a structure that is made from a high-friction material that acts on the track 3742 or associated structures to restrain sliding of the track 3742 until a sufficiently high external force is applied.

Figure 41:
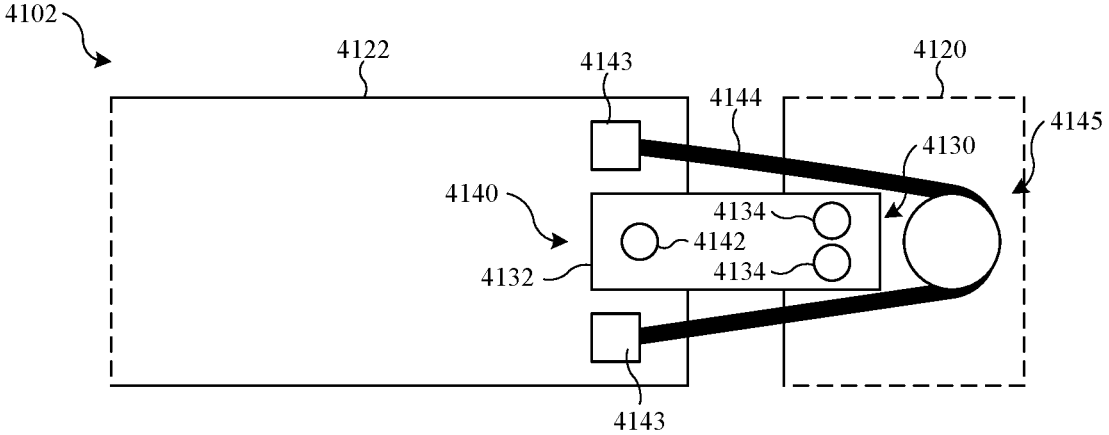
FIG. 41 is a side view illustration showing part of a frame assembly according to a tenth example implementation in a first elevational position.
Figure 42:
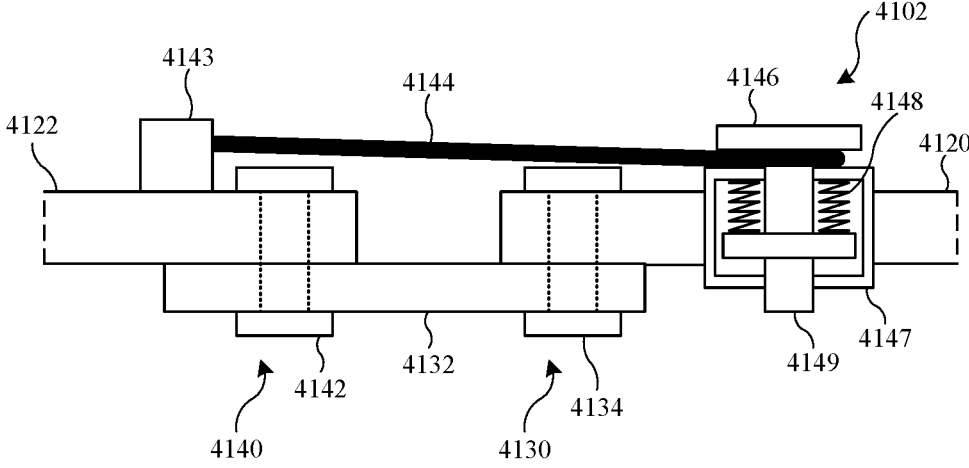
FIG. 42 is a top view illustration showing the part of the frame assembly of FIG. 41 in a first lateral position.
Figure 43:
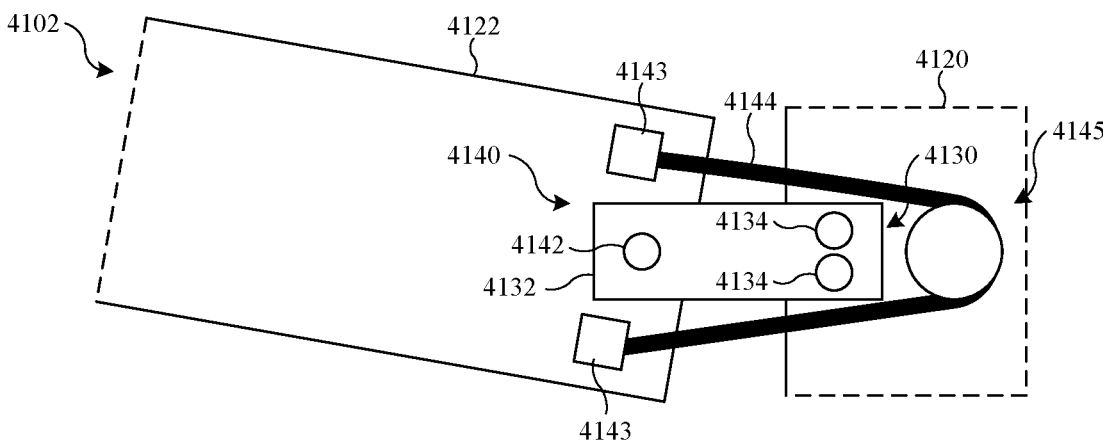
FIG. 43 is a side view illustration showing the part of the frame assembly of FIG. 41 in a second elevational position.
Figure 44:
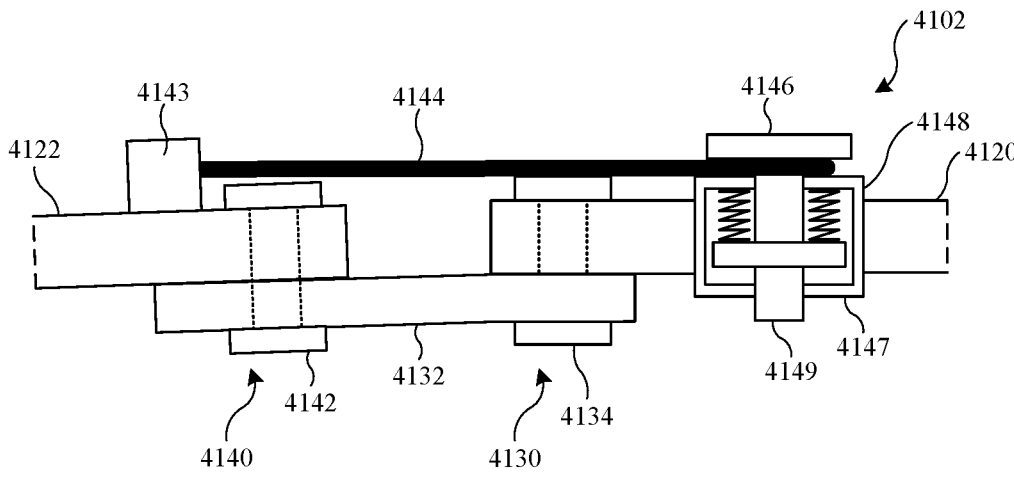
FIG. 44 is a top view illustration showing the part of the frame assembly of FIG. 41 in a second lateral position.

FIG. 41 is a side view illustration showing part of a frame assembly 4102 according to a tenth example implementation in a first elevational position, FIG. 42 is a top view illustration showing the part of the frame assembly 4102 in a first lateral position, FIG. 43 is a side view illustration showing the part of the frame assembly 4102 in a second elevational position, and FIG. 44 is a top view illustration showing the part of the frame assembly 4102 in a second lateral position. The portions of the frame assembly 4102 that are shown in FIGS. 41-44 may be incorporated in the electronic device 100 instead of corresponding portions of the frame assembly 102, including the first joint 224 and the second joint 226.

The frame assembly 4102 includes a frame portion 4120, an arm portion 4122, a lateral joint 4130, and an elevational joint 4140. The description of the frame assembly 102 and its components is applicable to the frame assembly 4102 and its components except as otherwise described herein.

The lateral joint 4130 is connected to the frame portion 4120 and to the elevational joint 4140. The lateral joint 4130 is a structure that allows for lateral motion and adjustment of the arm portion 4122 with respect to the frame portion 4120 in a lateral direction and/or angle around a generally up-down axis. The lateral joint 4130 is biased toward the first lateral position (FIG. 42), which is a neutral position of the lateral joint 4130 that the lateral joint 4130 returns to in the absence of an external force applied to the lateral joint 4130 and/or the arm portion 4122 of the frame assembly 4102. The lateral joint 4130 is movable away from the first lateral position in a first lateral direction and a second lateral direction (e.g., toward and away from the user's head). As an example, the lateral joint 4130 can be moved away from the first lateral position to the second lateral position (FIG. 44) by application of an external force that causes deflection of the lateral joint 4130.

In the illustrated example, the lateral joint 4130 includes a flexible element 4132, a fixed connection to the frame portion 4120, and a direct connection to the elevational joint 4140, which connects the lateral joint 4130 to the arm portion 4122. The fixed connection of the lateral joint 4130 to the frame portion 4120 is defined by pins 4134. The flexible element 4132 is a structure that is flexible in the lateral direction so that it is able to bend laterally and return to its neutral position (e.g., corresponding to the first lateral position) when an external force is removed. The flexible element 4132 may be inflexible in other directions, such as the elevational direction. As one example, the flexible element 4132 may be a thin, substantially planar, sheet metal (e.g., steel) structure oriented so that the lateral direction is substantially normal to the planar surfaces of the sheet metal structure.

The pins 4134 (two pins in the illustrated implementation) extend through holes formed in the flexible element 4132 and the frame portion 4120 and are fixed in place in the holes by fasteners, crimping, or other structures or techniques. The pins 4134 connect the flexible element 4132 to the frame portion 4120 so that the flexible element 4132 is restrained from rotating with respect to the frame portion 4120 to define the fixed connection of the lateral joint 4130 to the frame portion 4120. In the illustrated implementation, two of the pins 4134 are used at the fixed connection to resist rotation. Alternatively, a single pin at the fixed connection could be provided with anti-rotation features (e.g., a square profile) to resist rotation.

The elevational joint 4140 is connected to the flexible element 4132 of the lateral joint 4130 and to the arm portion 4122 of the frame assembly 4102. The elevational joint 4140 is a rotating joint. The elevational joint 4140 connects the arm portion 4122 to the lateral joint 4130 and the frame portion 4120 of the frame assembly 4102 so that the arm portion 4122 of the frame assembly 4102 is able to rotate with respect to the frame portion 4120 of the frame assembly 4102.

The elevational joint 4140 includes a cable clamp assembly that restrains pivoting motion of the arm portion 4122 with respect to the frame portion 4120. As will be described in detail, the cable clamp assembly includes a cable that extends between the arm portion 4122 and the frame portion 4120 and a cable clamp that is able to engage the cable. In an engaged position, the cable clamp resists motion of the cable which restrains rotation of the arm portion 4122 with respect to the frame portion 4120. In a disengaged position, the cable clamp does not resist substantially resist motion of the cable and allows rotation of the arm portion 4122 with respect to the frame portion 4120. Thus, the elevational joint 4140 may be moved from a first elevational position (FIG. 41) while the cable clamp is in the disengaged position (e.g., moved to the disengaged position by the user) to a second elevational position (FIG. 43) where the elevational joint 4140 may be held in place by returning the cable clamp to the engaged position.

The elevational joint 4140 includes a pin 4142 that allows rotation of the arm portion 4122 relative to the lateral joint 4130. In the illustrated example, the pin 4142 extends through (e.g., into or completely through) holes that are formed in the flexible element 4132 of the lateral joint 4130 and the arm portion 4122 of the frame assembly 4102. The pin 4142 may be, for example, secured against rotation with respect to the flexible element 4132 of the lateral joint 4130, for example, by geometric features, welding, brazing, adhesives, and/or other structures and/or techniques. The pin 4142 is rotatable with respect to the arm portion 4122. The pin 4142 may be freely rotatable with respect to the arm portion 4122 absent engagement of detent features.

In the illustrated example, the cable clamp assembly includes connectors 4143, a cable 4144, and a pulley 4145. The cable 4144 is a flexible element (e.g., a wire or a cord) that has its ends connected to the arm portion 4122 by the connectors 4143, which are any type of securing structure, such as a fastener, that can hold the ends of the cable 4144 is a fixed relationship with respect to the arm portion 4122.

The cable 4144 extends around the pulley, such that the cable 4144 must slide around the pulley 4145 when the arm portion 4122 rotates with respect to the frame portion 4120. As will be explained, the clamping features of the cable clamp assembly are associated or included in the pulley 4145 so that rotation can be restrained in the engaged position of the cable clamp assembly.

As seen FIG. 42, the pulley 4145 includes a head portion 4146, a housing 4147, a spring 4148, and a release structure 4149. In the illustrated example, the cable 4144 extends between the head portion 4146 and the housing 4147. The spring 4148 urges the head portion 4146 toward the housing 4147 to clamp the cable 4144 between the head portion 4146 and the housing 4147 in the engaged position. The release structure 4149 (e.g., a user-operable button defined by an end portion of the pulley 4145 in the illustrated implementation) causes the cable clamp assembly to move to the disengaged position. In the illustrated example, a force applied to the release structure 4149 moves the pulley 4145 against the spring 4148 to move the head portion 4146 from the housing 4147 to release the clamping engagement of the pulley 4145 with the cable 4144 so that the cable 4144 can slide around the pulley 4145 and thereby allow rotation of the arm portion 4122 with respect to the frame portion 4120.

Figure 45:
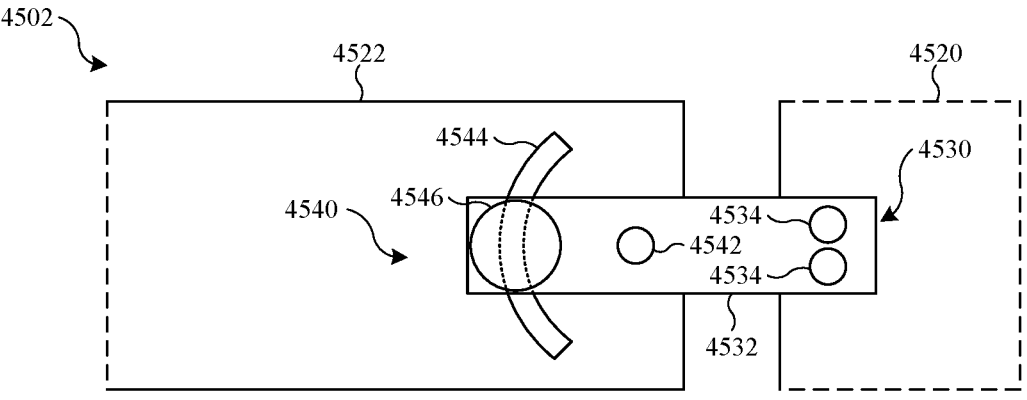
FIG. 45 is a side view illustration showing part of a frame assembly according to an eleventh example implementation in a first elevational position.
Figure 46:
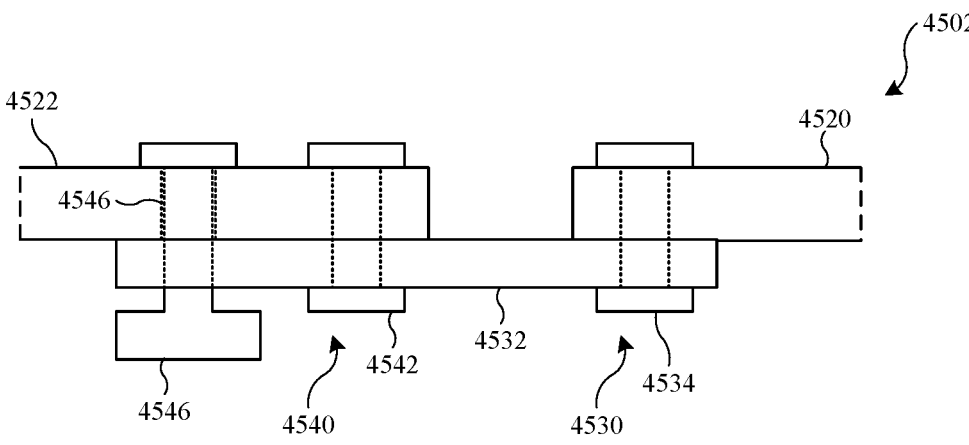
FIG. 46 is a top view illustration showing the part of the frame assembly of FIG. 45 in a first lateral position.
Figure 47:
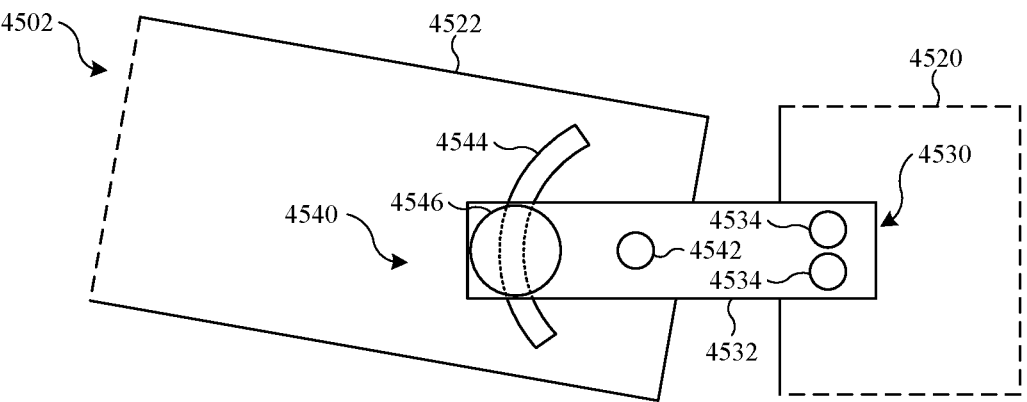
FIG. 47 is a side view illustration showing the part of the frame assembly of FIG. 45 in a second elevational position.
Figure 48:
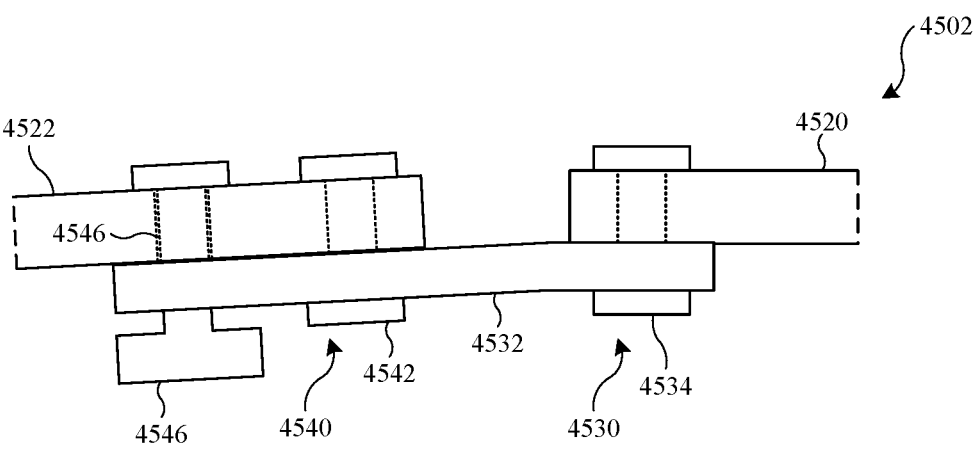
FIG. 48 is a top view illustration showing the part of the frame assembly of FIG. 45 in a second lateral position.

FIG. 45 is a side view illustration showing part of a frame assembly 4502 according to an eleventh example implementation in a first elevational position, FIG. 46 is a top view illustration showing the part of the frame assembly 4502 in a first lateral position, FIG. 47 is a side view illustration showing the part of the frame assembly 4502 in a second elevational position, and FIG. 48 is a top view illustration showing the part of the frame assembly 4502 in a second lateral position. The portions of the frame assembly 4502 that are shown in FIGS. 45-48 may be incorporated in the electronic device 100 instead of corresponding portions of the frame assembly 102, including the first joint 224 and the second joint 226.

The frame assembly 4502 includes a frame portion 4520, an arm portion 4522, a lateral joint 4530, and an elevational joint 4540. The description of the frame assembly 102 and its components is applicable to the frame assembly 4502 and its components except as otherwise described herein.

The lateral joint 4530 is connected to the frame portion 4520 and to the elevational joint 4540. The lateral joint 4530 is a structure that allows for lateral motion and adjustment of the arm portion 4522 with respect to the frame portion 4520 in a lateral direction and/or angle around a generally up-down axis. The lateral joint 4530 is biased toward the first lateral position (FIG. 46), which is a neutral position of the lateral joint 4530 that the lateral joint 4530 returns to in the absence of an external force applied to the lateral joint 4530 and/or the arm portion 4522 of the frame assembly 4502. The lateral joint 4530 is movable away from the first lateral position in a first lateral direction and a second lateral direction (e.g., toward and away from the user's head). As an example, the lateral joint 4530 can be moved away from the first lateral position to the second lateral position (FIG. 48) by application of an external force that causes deflection of the lateral joint 4530.

In the illustrated example, the lateral joint 4530 includes a flexible element 4532, a fixed connection to the frame portion 4520, and a direct connection to the elevational joint 4540, which connects the lateral joint 4530 to the arm portion 4522. The fixed connection of the lateral joint 4530 to the frame portion 4520 is defined by pins 4534. The flexible element 4532 is a structure that is flexible in the lateral direction so that it is able to bend laterally and return to its neutral position (e.g., corresponding to the first lateral position) when an external force is removed. The flexible element 4532 may be inflexible in other directions, such as the elevational direction. As one example, the flexible element 4532 may be a thin, substantially planar, sheet metal (e.g., steel) structure oriented so that the lateral direction is substantially normal to the planar surfaces of the sheet metal structure.

The pins 4534 (two pins in the illustrated implementation) extend through holes formed in the flexible element 4532 and the frame portion 4520 and are fixed in place in the holes by fasteners, crimping, or other structures or techniques. The pins 4534 connect the flexible element 4532 to the frame portion 4520 so that the flexible element 4532 is restrained from rotating with respect to the frame portion 4520 to define the fixed connection of the lateral joint 4530 to the frame portion 4520. In the illustrated implementation, two of the pins 4534 are used at the fixed connection to resist rotation. Alternatively, a single pin at the fixed connection could be provided with anti-rotation features (e.g., a square profile) to resist rotation.

The elevational joint 4540 is connected to the flexible element 4532 of the lateral joint 4530 and to the arm portion 4522 of the frame assembly 4502. The elevational joint 4540 is a rotating joint. The elevational joint 4540 connects the arm portion 4522 to the lateral joint 4530 and the frame portion 4520 of the frame assembly 4502 so that the arm portion 4522 of the frame assembly 4502 is able to rotate with respect to the frame portion 4520 of the frame assembly 4502.

The elevational joint 4540 includes a slot and clamp assembly that allows the arm portion 4522 to be pivoted with respect to the frame portion 4520 in a disengaged position (e.g., unclamped position) and allows the arm portion 4522 to be held at a fixed angular orientation in an engaged position (e.g., a clamped position). In the disengaged position, the elevational joint 4540 allows movement from a first elevational position (FIG. 45) to a second elevational position (FIG. 47) where the elevational joint 4540 may be held in place by returning the slot and clamp assembly to the engaged position.

The elevational joint 4540 includes a pin 4542 that allows rotation of the arm portion 4522 relative to the lateral joint 4530. In the illustrated example, the pin 4542 extends through (e.g., into or completely through) holes that are formed in the flexible element 4532 of the lateral joint 4530 and the arm portion 4522 of the frame assembly 4502. The pin 4542 may be, for example, secured against rotation with respect to the flexible element 4532 of the lateral joint 4530, for example, by geometric features, welding, brazing, adhesives, and/or other structures and/or techniques. The pin 4542 is rotatable with respect to the arm portion 4522. The pin 4542 may be freely rotatable with respect to the arm portion 4522 absent engagement of detent features.

In the illustrated example, the slot and clamp assembly includes a slot 4544 and a clamp 4546. The slot 4544 extends through the arm portion 4522 and is arcuate to match the path of the clamp 4546, which remains in a fixed positioned relative to the flexible element 4532 of the lateral joint 4530 when the arm portion 4522 is rotated with respect to the lateral joint at the pin 4542. Thus, for example, the slot 4544 may be in the shape of a slot that is centered on the pin 4542. The clamp 4546 is operable to restrain relative motion of the lateral joint 4530 and the arm portion 4522 in the clamped position. In the illustrated example, the clamp 4546 is a screw clamp type structure that extends through a hole formed in the flexible element 4532 of the lateral joint 4530 and extends through the slot 4544. The clamp 4546 may, for example, expand laterally to move to the disengaged position and contract laterally to move to the engaged position. Thus, the elevational joint 4540 includes the slot 4544 and the clamp 4546 that extends through the slot 4544 and is engageable to restrain motion of the elevational joint 4540.

Figure 49:
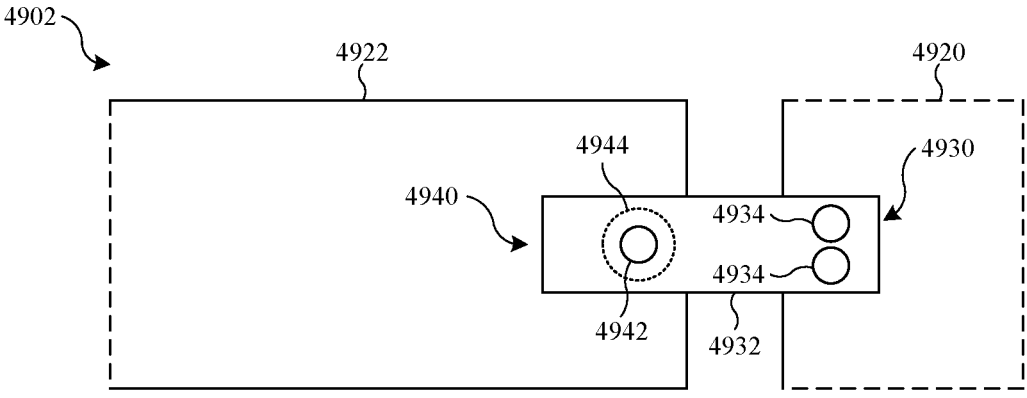
FIG. 49 is a side view illustration showing part of a frame assembly according to a twelfth example implementation in a first elevational position.
Figure 50:
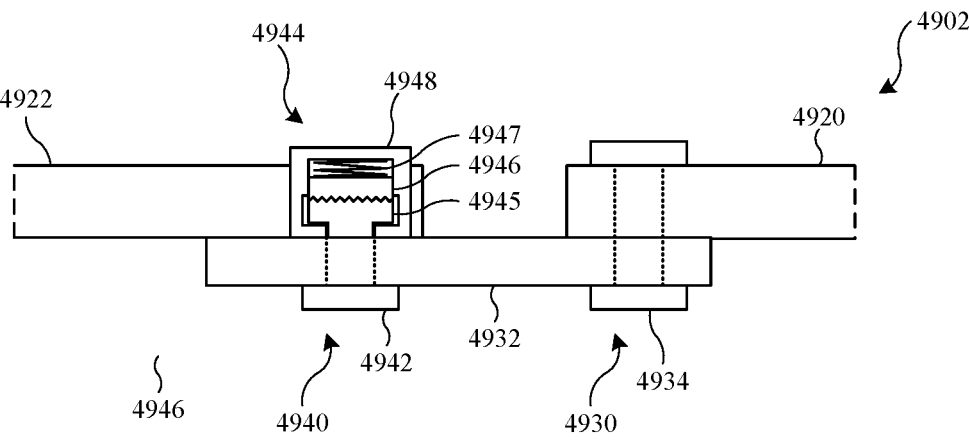
FIG. 50 is a top view illustration showing the part of the frame assembly of FIG. 49 in a first lateral position.
Figure 51:
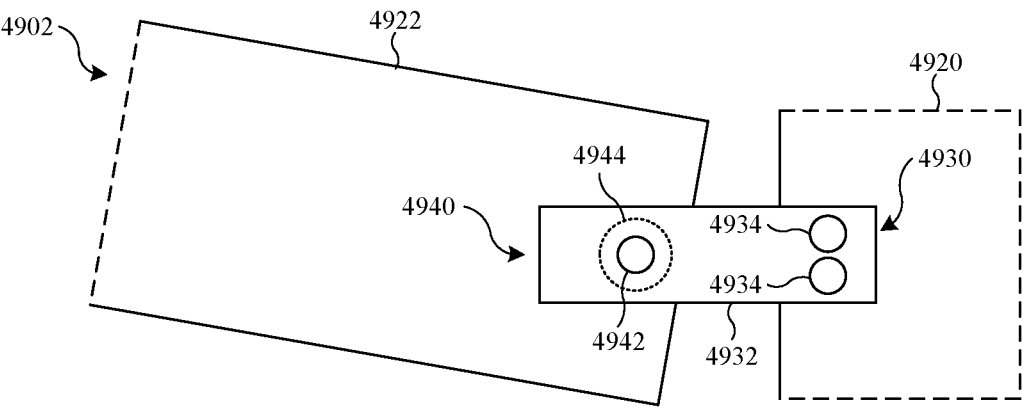
FIG. 51 is a side view illustration showing the part of the frame assembly of FIG. 49 in a second elevational position.
Figure 52:
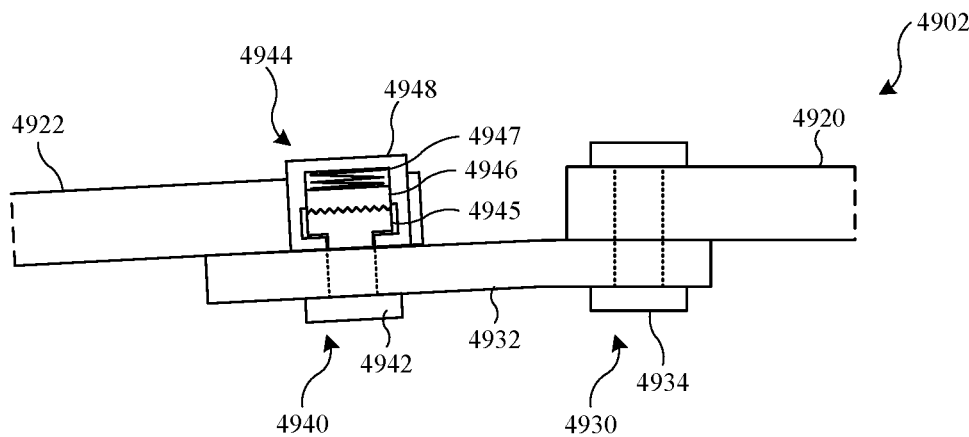
FIG. 52 is a top view illustration showing the part of the frame assembly of FIG. 49 in a second lateral position.

FIG. 49 is a side view illustration showing part of a frame assembly 4902 according to a twelfth example implementation in a first elevational position, FIG. 50 is a top view illustration showing the part of the frame assembly 4902 in a first lateral position, FIG. 51 is a side view illustration showing the part of the frame assembly 4902 in a second elevational position, and FIG. 52 is a top view illustration showing the part of the frame assembly 4902 in a second lateral position. The portions of the frame assembly 4902 that are shown in FIGS. 49-52 may be incorporated in the electronic device 100 instead of corresponding portions of the frame assembly 102, including the first joint 224 and the second joint 226.

The frame assembly 4902 includes a frame portion 4920, an arm portion 4922, a lateral joint 4930, and an elevational joint 4940. The description of the frame assembly 102 and its components is applicable to the frame assembly 4902 and its components except as otherwise described herein.

The lateral joint 4930 is connected to the frame portion 4920 and to the elevational joint 4940. The lateral joint 4930 is a structure that allows for lateral motion and adjustment of the arm portion 4922 with respect to the frame portion 4920 in a lateral direction and/or angle around a generally up-down axis. The lateral joint 4930 is biased toward the first lateral position (FIG. 50), which is a neutral position of the lateral joint 4930 that the lateral joint 4930 returns to in the absence of an external force applied to the lateral joint 4930 and/or the arm portion 4922 of the frame assembly 4902. The lateral joint 4930 is movable away from the first lateral position in a first lateral direction and a second lateral direction (e.g., toward and away from the user's head). As an example, the lateral joint 4930 can be moved away from the first lateral position to the second lateral position (FIG. 52) by application of an external force that causes deflection of the lateral joint 4930.

In the illustrated example, the lateral joint 4930 includes a flexible element 4932, a fixed connection to the frame portion 4920, and a direct connection to the elevational joint 4940, which connects the lateral joint 4930 to the arm portion 4922. The fixed connection of the lateral joint 4930 to the frame portion 4920 is defined by pins 4934. The flexible element 4932 is a structure that is flexible in the lateral direction so that it is able to bend laterally and return to its neutral position (e.g., corresponding to the first lateral position) when an external force is removed. The flexible element 4932 may be inflexible in other directions, such as the elevational direction. As one example, the flexible element 4932 may be a thin, substantially planar, sheet metal (e.g., steel) structure oriented so that the lateral direction is substantially normal to the planar surfaces of the sheet metal structure.

The pins 4934 (two pins in the illustrated implementation) extend through holes formed in the flexible element 4932 and the frame portion 4920 and are fixed in place in the holes by fasteners, crimping, or other structures or techniques. The pins 4934 connect the flexible element 4932 to the frame portion 4920 so that the flexible element 4932 is restrained from rotating with respect to the frame portion 4920 to define the fixed connection of the lateral joint 4930 to the frame portion 4920. In the illustrated implementation, two of the pins 4934 are used at the fixed connection to resist rotation. Alternatively, a single pin at the fixed connection could be provided with anti-rotation features (e.g., a square profile) to resist rotation.

The elevational joint 4940 is connected to the flexible element 4932 of the lateral joint 4930 and to the arm portion 4922 of the frame assembly 4902. The elevational joint 4940 is a rotating joint. The elevational joint 4940 connects the arm portion 4922 to the lateral joint 4930 and the frame portion 4920 of the frame assembly 4902 so that the arm portion 4922 of the frame assembly 4902 is able to rotate with respect to the frame portion 4920 of the frame assembly 4902.

The elevational joint 4940 includes a pin 4942 and a clutch 4944 that is connected to the pin 4942. The clutch 4944 allows the arm portion 4922 to be pivoted with respect to the frame portion 4920 when the rotational force applied (e.g., to the arm portion 4922 by a user) exceeds a threshold valued (e.g., according to a holding torque of the clutch 4944). The elevational joint 4940 allows movement from a first elevational position (FIG. 49) to a second elevational position (FIG. 51) where the elevational joint 4940 may be held in place by the holding torque of the clutch 4944 until a force sufficient to overcome the clutch 4944 is applied.

The pin 4942 allows rotation of the arm portion 4922 relative to the lateral joint 4930 when the clutch 4944 is disengaged. In the illustrated example, the pin 4942 extends through (e.g., into or completely through) holes that are formed in the flexible element 4932 of the lateral joint 4930. The pin 4942 may be, for example, secured against rotation with respect to the flexible element 4932 of the lateral joint 4930, for example, by geometric features, welding, brazing, adhesives, and/or other structures and/or techniques. The pin 4942 is rotatable with respect to the arm portion 4922 (e.g., rotatably coupled to the arm portion 4922) when the clutch 4944 is disengaged.

The clutch 4944 includes two engageable clutch elements, which in the illustrated implementation are a first gear 4945 and a second gear 4946. The clutch 4944 also includes a spring 4947 that biases the first gear 4945 and the second gear 4946 into engagement with one another. The first gear 4945, the second gear 4946, and the spring 4947, are located in a clutch housing 4948 in the illustrated implementation. The clutch housing 4948 may, for example, be connected to or defined by the arm portion 4922.

As an example, the first gear 4945 and the second gear 4946 may be crown gears. The first gear 4945 is fixed to the pin 4942 and rotates in unison with the lateral joint 4930. The second gear 4946 is restrained against rotation with respect to the arm portion 4922. One of the first gear 4945 or the second gear 4946 is able to translate away from the other gear against the force of a spring 4947. The force applied by the spring 4947 maintains the first gear 4945 and the second gear 4946 (or other clutch elements) in engagement with one another to define the engaged position and resist rotation. When the rotational force that is applied to the clutch 4944 overcomes the spring 4947, the first gear 4945 and the second gear 4946 (or other clutch elements) slip with respect to each other, and the arm portion 4922 rotates with respect to the lateral joint 4930 and the frame portion 4920. Thus, the elevational joint 4940 includes the clutch 4944, the clutch 4944 is able to restrain motion of the elevational joint 4940, and the clutch 4944 is able to slip to allow motion of the elevational joint 4940 in response to an external force of sufficient magnitude to overcome a holding force of the clutch 4944.

Figures 53, 54:
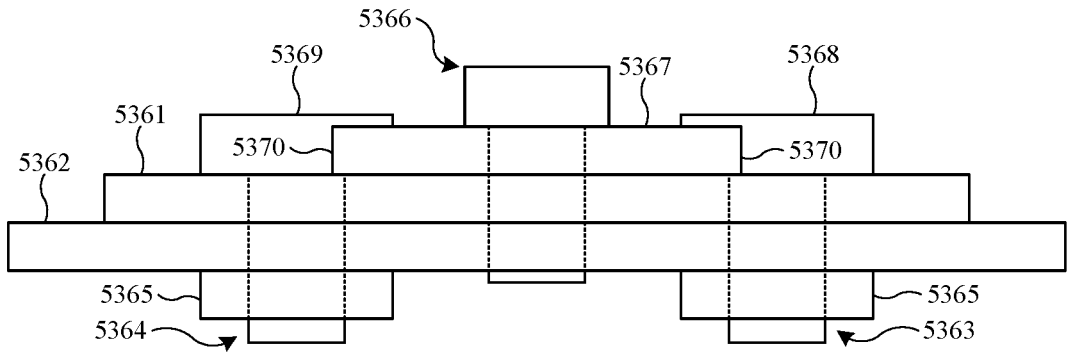
FIG. 53 is a side view illustration of a fixed joint according to an example.
FIG. 54 is a front view illustration of the fixed joint of FIG. 53.

FIG. 53 is a side view of a fixed joint 5360 according to an example. FIG. 54 is a front view of the fixed joint 5360.

The fixed joint 5360 is an example of a joint that can be used to connected two structures that do not rotate with respect to each other, and are subjected to torque loads that they resist. In such joints, resisting torque loads can cause some types of conventional fasteners to loosen. The fixed joint 5360 may be used to implement the fixed connections that are described herein, such as fixed connections of the lateral joints to parts of frame assemblies in the previously-described implementations. Thus, the fixed joint 5360 may be incorporated as a portion of a frame assembly of an electronic device, such as the frame assembly 102 of the electronic device 100.

The fixed joint 5360 connects a first part 5361 to a second part 5362 and includes a first threaded fastener 5363 and a second threaded fastener 5364 that are spaced from each other. The first threaded fastener 5363 and the second threaded fastener 5364 each extend through the first part 5361 and the second part 5362 to secure them to each other. As examples, the first threaded fastener 5363 and the second threaded fastener 5364 may be screws or bolts. The first threaded fastener 5363 and the second threaded fastener 5364 may engage screw threads formed on one or both of the first part 5361 and the second part 5362 and/or may be threaded to other components, such as nuts 5365.

To prevent loosening of the first threaded fastener 5363 and the second threaded fastener 5364, the fixed joint 5360 includes a wedge plate 5367. The wedge plate 5367 is a thin, plate-like member formed from a relatively rigid material that is able to flex or deform to some extent when loaded. As an example, the wedge plate 5367 may be formed from sheet steel.

The wedge plate 5367 is located between the first threaded fastener 5363 and the second threaded fastener 5364 and is secured to the first part 5361 and the second part 5362 by a third threaded fastener 5366. The wedge plate 5367 engages a first head portion 5368 of the first threaded fastener 5363 and a second head portion 5369 of the second threaded fastener 5364. The wedge plate 5367 may include engaging features 5370 (e.g., contours, facets, geometric configurations, etc.) that are formed on its ends for engagement with complementary features that are defined on the first head portion 5368 and the second head portion 5369.

Prior to connection to the first part 5361 and the second part 5362, the wedge plate 5367 may have a curved profile that is flattened somewhat by connection of the wedge plate 5367 to the first part 5361 and the second part 5362 by the third threaded fastener 5366. This slight flattening drives the ends of the wedge plate 5367 outward into engagement with the first threaded fastener 5363 and the second threaded fastener 5364 so that the engaging features 5370 of the wedge plate 5367 are in engagement with the first head portion 5368 and the second head portion 5369 to resist rotation of the first threaded fastener 5363 and the second threaded fastener 5364.

In one implementation the fixed joint 5360 is fixed joint for a frame assembly that includes a first part and a second part and includes a first fastener that connects the first part to the second part, a second fastener that connects the first part to the second part, and a wedge plate that is connected between the first fastener and the second fastener to engage the first fastener and the second fastener so that the wedge plate restrains rotation of the first fastener and the second fastener with respect to the first part and the second part.

A physical environment refers to a physical world that people can sense and/or interact with without aid of electronic systems. Physical environments, such as a physical park, include physical articles, such as physical trees, physical buildings, and physical people. People can directly sense and/or interact with the physical environment, such as through sight, touch, hearing, taste, and smell.

In contrast, a computer-generated reality (CGR) environment refers to a wholly or partially simulated environment that people sense and/or interact with via an electronic system. In CGR, a subset of a person's physical motions, or representations thereof, are tracked, and, in response, one or more characteristics of one or more virtual objects simulated in the CGR environment are adjusted in a manner that comports with at least one law of physics. For example, a CGR system may detect a person's head turning and, in response, adjust graphical content and an acoustic field presented to the person in a manner similar to how such views and sounds would change in a physical environment. In some situations (e.g., for accessibility reasons), adjustments to characteristic(s) of virtual object(s) in a CGR environment may be made in response to representations of physical motions (e.g., vocal commands).

A person may sense and/or interact with a CGR object using any one of their senses, including sight, sound, touch, taste, and smell. For example, a person may sense and/or interact with audio objects that create three-dimensional or spatial audio environment that provides the perception of point audio sources in three-dimensional space. In another example, audio objects may enable audio transparency, which selectively incorporates ambient sounds from the physical environment with or without computer-generated audio. In some CGR environments, a person may sense and/or interact only with audio objects.

Examples of CGR include virtual reality and mixed reality.

A virtual reality (VR) environment refers to a simulated environment that is designed to be based entirely on computer-generated sensory inputs for one or more senses. A VR environment comprises a plurality of virtual objects with which a person may sense and/or interact. For example, computer-generated imagery of trees, buildings, and avatars representing people are examples of virtual objects. A person may sense and/or interact with virtual objects in the VR environment through a simulation of the person's presence within the computer-generated environment, and/or through a simulation of a subset of the person's physical movements within the computer-generated environment.

In contrast to a VR environment, which is designed to be based entirely on computer-generated sensory inputs, a mixed reality (MR) environment refers to a simulated environment that is designed to incorporate sensory inputs from the physical environment, or a representation thereof, in addition to including computer-generated sensory inputs (e.g., virtual objects). On a virtuality continuum, a mixed reality environment is anywhere between, but not including, a wholly physical environment at one end and virtual reality environment at the other end.

In some MR environments, computer-generated sensory inputs may respond to changes in sensory inputs from the physical environment. Also, some electronic systems for presenting an MR environment may track location and/or orientation with respect to the physical environment to enable virtual objects to interact with real objects (that is, physical articles from the physical environment or representations thereof). For example, a system may account for movements so that a virtual tree appears stationery with respect to the physical ground.

Examples of mixed realities include augmented reality and augmented virtuality.

An augmented reality (AR) environment refers to a simulated environment in which one or more virtual objects are superimposed over a physical environment, or a representation thereof. For example, an electronic system for presenting an AR environment may have a transparent or translucent display through which a person may directly view the physical environment. The system may be configured to present virtual objects on the transparent or translucent display, so that a person, using the system, perceives the virtual objects superimposed over the physical environment. Alternatively, a system may have an opaque display and one or more imaging sensors that capture images or video of the physical environment, which are representations of the physical environment. The system composites the images or video with virtual objects, and presents the composition on the opaque display. A person, using the system, indirectly views the physical environment by way of the images or video of the physical environment, and perceives the virtual objects superimposed over the physical environment. As used herein, a video of the physical environment shown on an opaque display is called "pass-through video," meaning a system uses one or more image sensor(s) to capture images of the physical environment, and uses those images in presenting the AR environment on the opaque display. Further alternatively, a system may have a projection system that projects virtual objects into the physical environment, for example, as a hologram or on a physical surface, so that a person, using the system, perceives the virtual objects superimposed over the physical environment.

An augmented reality environment also refers to a simulated environment in which a representation of a physical environment is transformed by computer-generated sensory information. For example, in providing pass-through video, a system may transform one or more sensor images to impose a select perspective (e.g., viewpoint) different than the perspective captured by the imaging sensors. As another example, a representation of a physical environment may be transformed by graphically modifying (e.g., enlarging) portions thereof, such that the modified portion may be representative but not photorealistic versions of the originally captured images. As a further example, a representation of a physical environment may be transformed by graphically eliminating or obfuscating portions thereof.

An augmented virtuality (AV) environment refers to a simulated environment in which a virtual or computer-generated environment incorporates one or more sensory inputs from the physical environment. The sensory inputs may be representations of one or more characteristics of the physical environment. For example, an AV park may have virtual trees and virtual buildings, but people with faces photorealistically reproduced from images taken of physical people. As another example, a virtual object may adopt a shape or color of a physical article imaged by one or more imaging sensors. As a further example, a virtual object may adopt shadows consistent with the position of the sun in the physical environment.

There are many different types of electronic systems that enable a person to sense and/or interact with various CGR environments. Examples include head-mounted systems, projection-based systems, heads-up displays (HUDs), vehicle windshields having integrated display capability, windows having integrated display capability, displays formed as lenses designed to be placed on a person's eyes (e.g., similar to contact lenses), headphones/earphones, speaker arrays, input systems (e.g., wearable or handheld controllers with or without haptic feedback), smartphones, tablets, and desktop/laptop computers. A head-mounted system may have one or more speaker(s) and an integrated opaque display. Alternatively, a head-mounted system may be configured to accept an external opaque display (e.g., a smartphone). The head-mounted system may incorporate one or more imaging sensors to capture images or video of the physical environment, and/or one or more microphones to capture audio of the physical environment. Rather than an opaque display, a head-mounted system may have a transparent or translucent display. The transparent or translucent display may have a medium through which light representative of images is directed to a person's eyes. The display may utilize digital light projection, OLEDs, LEDs, uLEDs, liquid crystal on silicon, laser scanning light source, or any combination of these technologies. The medium may be an optical waveguide, a hologram medium, an optical combiner, an optical reflector, or any combination thereof. In one embodiment, the transparent or translucent display may be configured to become opaque selectively. Projection-based systems may employ retinal projection technology that projects graphical images onto a person's retina. Projection systems also may be configured to project virtual objects into the physical environment, for example, as a hologram or on a physical surface.

As described above, one aspect of the present technology is the gathering and use of data available from various sources for use during operation of a head-mounted device. As an example, such data may identify the user and include user-specific settings or preferences. The present disclosure contemplates that in some instances, this gathered data may include personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, a user profile may be established that stores fit and comfort related information that allows the head-mounted device to be actively adjusted for a user. Accordingly, use of such personal information data enhances the user's experience.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of storing a user profile to adjustment of a head-mounted device, the present technology can be configured to allow users to select to "opt in" or "opt out" of participation in the collection of personal information data during registration for services or anytime thereafter. In another example, users can select not to provide data regarding usage of specific applications. In yet another example, users can select to limit the length of time that application usage data is maintained or entirely prohibit the development of an application usage profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, fit and comfort related parameters may be determined each time the head-mounted device is used, such as by scanning a user's face as they place the device on their head, and without subsequently storing the information or associating with the particular user.

What is claimed is:
1. An electronic device, comprising;
a light-emitting display system;
a frame portion that supports the light-emitting display system;
an arm portion;

a lateral joint that is connected to the frame portion, the lateral joint including a flexible material that is restrained from rotating with respect to the frame portion, wherein the flexible material is biased toward a neutral position and is movable away from the neutral position to define a lateral position of the arm portion with respect to the frame portion; and
an elevational joint that is connected to the arm portion, the elevational joint including:
a pin that extends through the flexible material of the lateral joint to define an axis, and axis, wherein the elevational joint is rotatable around the axis to allow the arm portion to pivot with respect to the frame portion; and
a clutch that is connected to the arm portion,
wherein the clutch is configured to restrain the arm portion from pivoting with respect to the frame portion by a spring that maintains clutch elements in engagement with one another by a force, and
wherein the clutch elements is configured to allow the arm portion to pivot around the axis when an external force is applied to the arm portion that exceeds a threshold value to overcome the force of the spring.
2. The electronic device of claim 1, wherein the lateral joint is a flexing joint.
3. The electronic device of claim 1, further comprising:
a lens that is supported by the frame portion;
sensors;
a computing device that is configured to generate content using the sensors, wherein the light-emitting display system is configured to cause display of the content as emitted light;
an optical system that is configured to present the emitted light in a user-perceivable form; and
a power source that supplies power to the computing device and the light-emitting display system.
4. The electronic device of claim 1, wherein the clutch elements comprise gears, and wherein the gears are configured to slip relative to one another when the external force is applied to the arm portion that exceeds the threshold value to overcome the force of the spring.
5. The electronic device of claim 4, wherein the gears are crown gears, and wherein the crown gears are configured to slip relative to one another when the external force is applied to the arm portion that exceeds the threshold value to overcome the force of the spring.
6. The electronic device of claim 5, wherein one of the crown gears is configured to translate relative to an other one of the crown gears.
7. The electronic device of claim 1, wherein:
the clutch elements comprise a first clutch element and a second clutch element;
the spring maintains the first clutch element and the second clutch element in engagement with one another by the force;
the first clutch element is fixed to the pin and rotates with the lateral joint; and
the second clutch element is restrained against rotation with respect to the arm portion.
8. The electronic device of claim 7, wherein the first clutch element is a first crown gear, wherein the second clutch element is a second crown gear, and wherein the first crown gear and the second crown gear are configured to slip relative to each other when the external force is applied to the arm portion that exceeds the threshold value to overcome the force of the spring.

9. The electronic device of claim 7, wherein the first clutch element or the second clutch element is configured to translate away from an other one of the first clutch element or the second clutch element.

10. An electronic device, comprising:

a frame portion;

a lens that is supported by the frame portion;

sensors;

a computing device that is configured to generate content using the sensors;

a light-emitting display system that is configured to cause display of the content as emitted light;

an optical system that is configured to present the emitted light in a user-perceivable form; and a power source that supplies power to the computing device and the light-emitting display system;

an arm portion;

a lateral joint that includes a flexible element that is configured to flex around a first axis, wherein the flexible element is fixedly connected to the frame portion; and an elevational joint that is connected to the arm portion, wherein the lateral joint is connected to the arm portion by the elevational joint, wherein the elevational joint is configured to rotate around a second axis that extends perpendicular to the first axis through the flexible element to rotationally connect the arm portion to the flexible element of the lateral joint, wherein the first axis intersects the second axis, and wherein the elevational joint includes a friction element that is configured to restrain rotation of the arm portion until an external force that is sufficient to overcome the friction element is applied to the elevational joint.

11. The electronic device of claim 10, wherein the lateral joint is biased toward a neutral position and is movable away from the neutral position to define a lateral position of the arm portion with respect to the frame portion, and the elevational joint is adjustable to define an elevational position of the arm portion with respect to the frame portion.

12. The electronic device of claim 10, wherein the first axis intersects the second axis such that the first axis and the second axis are co-located.

13. The electronic device of claim 10, wherein the friction element comprises a high-friction material.

14. The electronic device of claim 13, wherein the friction element comprises a rubber bushing.

15. An electronic device, comprising:

a computing device;

a light-emitting display system;

an optical system, wherein the computing device, the light-emitting display system, and the optical system cooperate to cause display of content that can be perceived by a user; and a frame assembly that includes a frame portion, a first arm portion, and a second arm portion, wherein each of the first arm portion and the second arm portion are connected to the frame portion by a lateral joint that includes a flexible material and an elevational joint that extends through the flexible material to rotatably couple the lateral joint to the elevational joint, wherein each elevational joint allows adjustment of an elevation position of a respective one of the first arm portion and the second arm portion, wherein each elevational joint is a rotating joint and includes a clutch mechanism, the clutch mechanism including:

a first clutch element;

a second clutch element movable relative to the first clutch element; and a spring that exerts a spring force to maintain the first clutch element and the second clutch element in engagement with one another, wherein the clutch mechanism of each elevational joint is configured to restrain rotation of a respective one of the first arm portion and the second arm portion and to allow rotation of the respective one of the first arm portion and the second arm portion when an external force is applied to the respective one of the first arm portion and the second arm portion that overcomes the spring force of the clutch mechanism, and wherein each lateral joint is connected to a respective one of the first arm portion and the second arm portion by a fixed connection and each lateral joint is connected to the frame portion by the elevational joint.

16. The electronic device of claim 15, wherein the lateral joint is a flexing joint.

17. The electronic device of claim 15, wherein the flexible material of each lateral joint is biased toward a neutral position, and the elevational joint includes a pin that extends through the flexible material to connect the lateral joint to the frame portion.

18. The electronic device of claim 15, wherein the clutch mechanism of each elevational joint includes a rubber gasket.

19. The electronic device of claim 15, wherein the first clutch element is a first gear and the second clutch element is a second gear, and wherein the first gear and the second gear are configured to slip relative to one another when the external force is applied to the respective one of the first arm portion and the second arm portion that overcomes the spring force of the clutch mechanism.

* * * * *